United States Patent
Shoji et al.

(10) Patent No.: US 10,545,406 B2
(45) Date of Patent: Jan. 28, 2020

(54) CURED FILM FORMED BY CURING PHOTOSENSITIVE RESIN COMPOSITION AND METHOD FOR MANUFACTURING SAME

(71) Applicant: TORAY INDUSTRIES, INC., Tokyo (JP)

(72) Inventors: Yu Shoji, Otsu (JP); Yuki Masuda, Otsu (JP); Kimio Isobe, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 64 days.

(21) Appl. No.: 15/744,676

(22) PCT Filed: Sep. 20, 2016

(86) PCT No.: PCT/JP2016/077674
§ 371 (c)(1),
(2) Date: Jan. 12, 2018

(87) PCT Pub. No.: WO2017/057089
PCT Pub. Date: Apr. 6, 2017

(65) Prior Publication Data
US 2018/0203353 A1 Jul. 19, 2018

(30) Foreign Application Priority Data
Sep. 28, 2015 (JP) .................................. 2015-189494

(51) Int. Cl.
*H01L 23/48* (2006.01)
*G03F 7/038* (2006.01)
(Continued)

(52) U.S. Cl.
CPC .......... *G03F 7/0387* (2013.01); *C08G 69/02* (2013.01); *C08G 69/40* (2013.01); *G03F 7/16* (2013.01);
(Continued)

(58) Field of Classification Search
CPC .............................. C08G 69/02; G03F 7/0387
(Continued)

(56) References Cited

U.S. PATENT DOCUMENTS 4,539,392 A * 9/1985 Kadoi .................. C08G 73/121
528/172
2004/0060635 A1 * 4/2004 Diepers ...................... C09J 5/06
156/60
(Continued)

FOREIGN PATENT DOCUMENTS

JP    2007-16214 A    1/2007
JP    2011-180473 A   9/2011
(Continued)

OTHER PUBLICATIONS

International Search Report, issued in PCT/JP2016/077674, PCT/ISA/210, dated Dec. 20, 2016.
(Continued)

*Primary Examiner* — Caleb E Henry
(74) *Attorney, Agent, or Firm* — Birch, Stewart, Kolasch & Birch, LLP

(57) ABSTRACT

Provided is a cured film of high elongation, low stress, and high adhesion to metal copper. The cured film is formed by curing a photosensitive resin composition, wherein the photosensitive resin comprises a polyhydroxyamide, and wherein the rate of ring-closure of the polyhydroxyamide in the cured film is not more than 10%.

17 Claims, 2 Drawing Sheets

(51) Int. Cl.
*C08G 69/02* (2006.01)
*G03F 7/40* (2006.01)
*G03F 7/20* (2006.01)
*C08G 69/40* (2006.01)
*G03F 7/16* (2006.01)
*G03F 7/26* (2006.01)
*H01L 23/00* (2006.01)

(52) U.S. Cl.
CPC .............. *G03F 7/161* (2013.01); *G03F 7/168* (2013.01); *G03F 7/20* (2013.01); *G03F 7/26* (2013.01); *G03F 7/40* (2013.01); *H01L 23/562* (2013.01); *H01L 24/02* (2013.01); *H01L 24/03* (2013.01); *H01L 24/05* (2013.01); *H01L 24/13* (2013.01); *H01L 2224/024* (2013.01); *H01L 2224/02331* (2013.01); *H01L 2224/0362* (2013.01); *H01L 2224/03462* (2013.01); *H01L 2224/03515* (2013.01); *H01L 2224/0401* (2013.01); *H01L 2224/05008* (2013.01); *H01L 2224/13026* (2013.01); *H01L 2924/0695* (2013.01); *H01L 2924/3511* (2013.01)

(58) Field of Classification Search
USPC .................................................. 257/737, 40
See application file for complete search history.

(56) References Cited

U.S. PATENT DOCUMENTS

2010/0092879 A1* 4/2010 Minegishi .............. C08G 69/26
　　　　　　　　　　　　　　　　　　　　　　　　430/18
2018/0194900 A1* 7/2018 Choi ........................... C08J 5/18
2019/0081258 A1* 3/2019 Masuda ................. C08G 73/10

FOREIGN PATENT DOCUMENTS

| JP | 2012-208360 A | 10/2012 |
| JP | 2013-256603 A | 12/2013 |
| JP | 2014-181311 A | 9/2014 |
| WO | WO 2008/111470 A1 | 9/2008 |
| WO | WO 2014/199800 A1 | 12/2014 |

OTHER PUBLICATIONS

Written Opinion of the International Searching Authority, issued in PCT/JP2016/077674, PCT/ISA/237, dated Dec. 20, 2016.

* cited by examiner

CURED FILM FORMED BY CURING PHOTOSENSITIVE RESIN COMPOSITION AND METHOD FOR MANUFACTURING SAME

TECHNICAL FIELD

The present invention relates to a cured film made from a photosensitive resin composition and a method of manufacturing the same. More particularly, the present invention relates to a photosensitive resin composition and a cured film made therefrom suitably used for a surface protection film and an interlayer insulating film in a semiconductor device and the like, and for an insulating layer in an organic electroluminescent device, and the like, as well as to a method of manufacturing the same.

BACKGROUND ART

Conventionally, polyimide resins and polybenzoxazole resins, which are excellent in heat resistance, electric insulation, and the like, have widely been used for a surface protection film or interlayer insulating film in a semiconductor device, an insulating layer in an organic electrolytic device, and/or a flattening film in a TFT substrate. Furthermore, photosensitive polyimides and photosensitive polybenzoxazoles to which photosensitive properties have been provided have been studied to enhance the overall productivity. However, those resins in the film form are well dissolved during development or much influenced by an environment in which they are used, and thus it has been indicated that they are difficult to use in industry.

On the one hand, a positive photosensitive resin composition containing a hydroxystyrene resin, a polyamic acid, and a quinonediazide compound has been proposed (Patent Literature 1). In this resin composition, the solubility in an alkaline solution, which is a developer solution, is reduced in an unexposed portion based on the interaction between the phenolic hydroxyl group of the hydroxystyrene resin and the quinonediazide compound. Consequently, the solubility in the alkaline solution is significantly increased in an exposed portion through the light-induced acid generation by the quinonediazide compound. This difference in the solubility in the alkaline solution between the unexposed portion and the exposed portion allows the production of a positive relief pattern.

Furthermore, a positive photosensitive resin composition containing a polyhydroxystyrene resin and alkoxymethyl group or methylol group has been proposed, which achieves an increased sensitivity and a lowered stress (Patent Literature 2).

On the other hand, a method of reducing the stress generated during the production of a cured film and thereby achieving a lower warpage has been proposed, in which a flexible alkyl group, alkylene-glycol group, and/or siloxane bond is introduced into the repeating unit of an alkali-soluble cyclized polyimide or polybenzoxazole (Patent Literature 3).

CITATION LIST

Patent Literatures

Patent Literature 1: JP 2007-156243 A
Patent Literature 2: JP 4692219 B2
Patent Literature 3: JP 2012-234030 A
Patent Literature 4: JP 2008-224984 A

SUMMARY OF INVENTION

Technical Problem

Cyclized polyimides containing a flexible group achieve a lowered stress, while they exhibit reduced mechanical properties, which have caused a problem of reduced resistance in a reliability test such as an anti-shock test.

Moreover, in polybenzoxazoles containing a flexible group synthesized from an aliphatic dicarboxylic acid (Patent Literature 4), dehydrating cyclization during the curing of the polybenzoxazoles leads to an increased stress on a substrate wafer, which easily causes insufficient reduction of stress. Moreover, it has caused a problem of lowered adhesion to metals (such as copper).

The present invention will solve problems associated with conventional techniques as described above and provide cured films of high elongation, low stress, and high adhesion to metals, particularly to copper, and semiconductor electronic components and semiconductor devices in which those cured films have been arranged.

Solution to Problem

In order to achieve the above object, the present invention relates to the following.

That is, the present invention relates to a cured film formed by curing a photosensitive resin composition, wherein the photosensitive resin composition comprises a polyhydroxyamide, and wherein the rate of ring-closure of the polyhydroxyamide in the cured film is not more than 10%.

Also, the present invention relates to a method of manufacturing the cured film, the method comprising the steps of: applying the photosensitive resin composition onto a substrate and drying it to form a photosensitive resin film, or forming a photosensitive sheet from the photosensitive resin composition and laminating it onto a substrate to form a photosensitive resin film; exposing the resulting film to light through a mask; dissolving or removing the exposed portion with an alkaline solution; and heat-treating the developed photosensitive resin film.

Also, the present invention relates to an interlayer insulating film or semiconductor protective film, semiconductor electronic component, and semiconductor device, to which the cured film has been arranged.

Advantageous Effects of Invention

According to the present invention, a cured film of high elongation, low stress, and high adhesion to metals, particularly to copper, can be obtained. Moreover, electronic components or semiconductor devices according to the present invention have a pattern having a preferable shape, preferable adhesion properties, and excellent heat resistance, which make them highly reliable.

DESCRIPTION OF EMBODIMENTS

Figure 1:
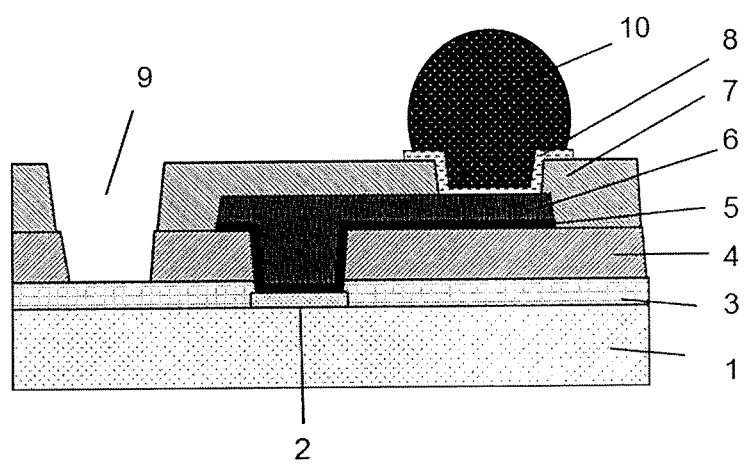
FIG. 1 depicts an enlarged cross-sectional view of a pad portion of a semiconductor device having a bump.

The cured film is a cured film formed by curing a photosensitive resin composition, wherein the photosensitive resin composition comprises a polyhydroxyamide, and wherein the rate of ring-closure of the polyhydroxyamide in the cured film is not more than 10%. That is, it may be a resin in which a part of particular poly(o-hydroxyamide) structural units in the cured film have been converted to oxazole.

In the form of a cured film, the rate of ring-closure of the polyhydroxyamide is preferably not less than 0.1% and not more than 10%. The rate of ring-closure of not less than 0.1% and not more than 10% can cause the increase of stress on a substrate wafer to be suppressed, which stress can be generated in the cured film. The rate of ring-closure refers to the rate of ring-closure of polyhydroxyamide structural units calculated through FT-IR measurement. Based on the detection limit of FT-IR measurement, any calculated rate of ring-closure should be not less than 0.1%. Moreover, a rate of ring-closure of not more than 10% causes increased bendability in the molecule and easy formation of entanglement between the strands of the molecule, which gives high elongation properties. Also, a rate of ring-closure of not more than 10% causes many polar groups to be left remaining, which can enhances adhesion to other materials such as molding resins or metals.

Examples of the polyhydroxyamide include, but are not limited to, poly(o-hydroxyamide), poly(m-hydroxyamide), poly(p-hydroxyamide), and the like.

The polyhydroxyamide contained in the cured film formed by curing the photosensitive resin composition of the present invention is a polyamide having a structural unit (A) represented by the general formula (1) and obtainable through the polycondensation of a dicarboxylic acid having a structure of $X^1(COOH)_2$ or a dicarboxylic acid derivative having a structure of $X^1(COZ)_2$ with a diamine having a structure of $Y^1(NH_2)_2$:

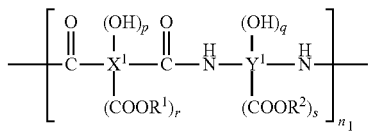

(1)

(wherein $X^1$ and $Y^1$ each independently represent an organic group having two to eight valences and containing two or more carbon atoms; $R^1$ and $R^2$ each independently represent either a hydrogen atom or a $C_1$-$C_{20}$ organic group; n1 is an integer number in the range from 2 to 500; p and q are each independently an integer number from 0 to 4; and r and s each independently represent an integer number from 0 to 2).

In the viewpoint of the solubility in an alkaline solution, the polyhydroxyamide of the present invention preferably comprises not less than 50%, and more preferably not less than 70%, of the repeating unit in which p or q is not less than 1 and not more than 4, relative to the total structural units.

Examples of the dicarboxylic acid having a structure of $X^1(COOH)_2$ or the dicarboxylic acid derivative having a structure of $X^1(COZ)_2$ include, but are not limited to, aromatic groups having $X^1$ selected from the structural formulae below:

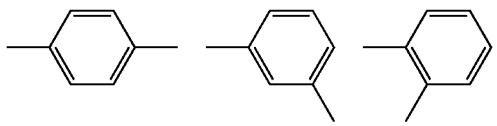

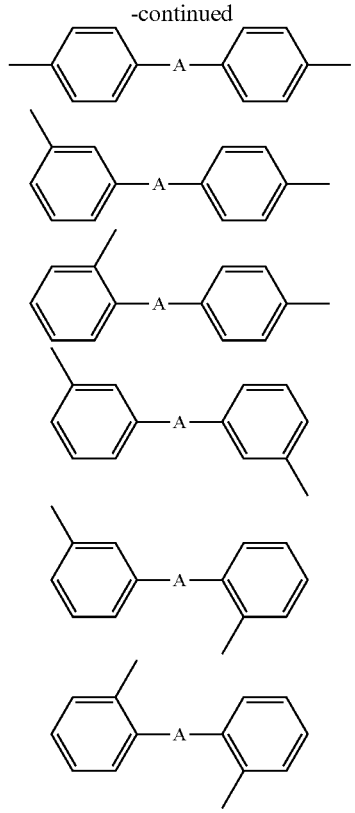

(wherein A has a bivalent group selected from the group consisting of —, —O—, —S—, —SO$_2$—, —COO—, —OCO—, —CONH—, —NHCO—, —C(CH$_3$)$_2$—, —C(CF$_3$)$_2$—).

For the dicarboxylic acid derivative having a structure of $X^1(COZ)_2$, Z is a group selected from $C_1$-$C_{12}$ organic groups or halogen elements, and is preferably selected from the structural formulae below:

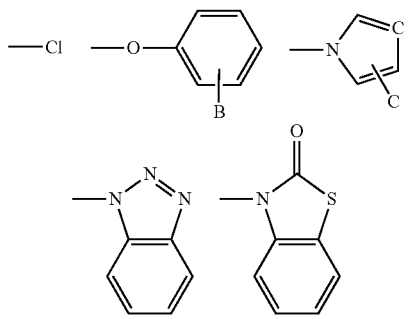

(wherein B and C are, but not limited to, a hydrogen atom, methyl group, ethyl group, propyl group, isopropyl group, t-butyl group, trifluoromethyl group, halogen group, phenoxy group, nitro group, or the like).

Examples of the diamine having a structure of $Y^1(NH_2)_2$ include, but are not limited to, aromatic diamines such as m-phenylenediamine, p-phenylenediamine, 3,5-diaminobenzoic acid, 1,5-naphthalenediamine, 2,6-naphthalenediamine, 9,10-anthracenediamine, 2,7-diaminofluorene, 4,4'-diaminobenzanilide, 3,4'-diaminodiphenylether, 4,4'-diaminodiphenyl ether, 3-carboxy-4,4'-diaminodiphenylether, 3-sulfonic acid-4,4'-diaminodiphenylether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenyl sulfide, 4,4'-diaminodiphenyl sulfide, 4-aminobenzoic acid 4-aminophenyl ester, 9,9-bis(4-aminophenyl)fluorene, 1,3-bis(4-anilino)tetramethyldisiloxane, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, bis(4-aminophenoxyphenyl)sulfone, bis(3-aminophenoxyphenyl)sulfone, bis(4-aminophenoxy)biphenyl, bis[4-(4-aminophenoxy)phenyl]ether, 2,2-bis[4-(4-aminophenoxy)phenyl]propane, 2,2-bis[4-(4-aminophenoxy)phenyl]hexafluoropropane, 1,4-bis(4-aminophenoxy)benzene, 1,3-bis(3-aminophenoxy)benzene, 1,3-bis(4-aminophenoxy)benzene, bis(3-amino-4-hydroxyphenyl)sulfone, bis(3-amino-4-hydroxyphenyl)propane, bis(3-amino-4-hydroxyphenyl)hexafluoropropane, bis(3-amino-4-hydroxyphenyl)methylene, bis(3-amino-4-hydroxyphenyl)ether, bis(3-amino-4-hydroxy)biphenyl, 4,4'-diamino-6,6'-bis(trifluoromethyl)-[1,1'-biphenyl]-3,3'-diol, 9,9-bis(3-amino-4-hydroxyphenyl)fluorene, 2,2'-bis[N-(3-aminobenzoyl)-3-amino-4-hydroxyphenyl]propane, 2,2'-bis[N-(3-aminobenzoyl)-3-amino-4-hydroxyphenyl]hexafluoropropane, 2,2'-bis[N-(4-aminobenzoyl)-3-amino-4-hydroxyphenyl]propane, 2,2'-bis[N-(4-aminobenzoyl)-3-amino-4-hydroxyphenyl]hexafluoropropane, bis[N-(3-aminobenzoyl)-3-amino-4-hydroxyphenyl]sulfone, bis[N-(4-aminobenzoyl)-3-amino-4-hydroxyphenyl]sulfone, 9,9-bis[N-(3-aminobenzoyl)-3-amino-4-hydroxyphenyl]fluorene, 9,9-bis[N-(4-aminobenzoyl)-3-amino-4-hydroxyphenyl]fluorene, N,N'-bis(3-aminobenzoyl)-2,5-diamino-1,4-dihydroxybenzene, N,N'-bis(4-aminobenzoyl)-2,5-diamino-1,4-dihydroxybenzene, N,N'-bis(4-aminobenzoyl)-4,4'-diamino-3,3-dihydroxybiphenyl, N,N'-bis(3-aminobenzoyl)-3,3'-diamino-4,4-dihydroxybiphenyl, N,N'-bis(4-aminobenzoyl)-3,3'-diamino-4,4-dihydroxybiphenyl, 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 1,4-bis(5-amino-2-benzoxazolyl)benzene, 1,4-bis(6-amino-2-benzoxazolyl)benzene, 1,3-bis(5-amino-2-benzoxazolyl)benzene, 1,3-bis(6-amino-2-benzoxazolyl)benzene, 2,6-bis(4-aminophenyl)benzobisoxazole, 2,6-bis(3-aminophenyl)benzobisoxazole, bis[(3-aminophenyl)-5-benzoxazolyl], bis[(4-aminophenyl)-5-benzoxazolyl], bis[(3-aminophenyl)-6-benzoxazolyl], bis[(4-aminophenyl)-6-benzoxazolyl], and the like, and compounds produced by substituting a part of hydrogen atoms in these aromatic rings with a $C_1$-$C_{10}$ alkyl group, a fluoroalkyl group, or a halogen atom, and compounds having any of the structure indicated below, and the like. Other diamines to be used for copolymerization can be used directly or as corresponding diisocyanate compounds or trimethylsilylated diamines. Moreover, these two or more diamine components may be used in combination.

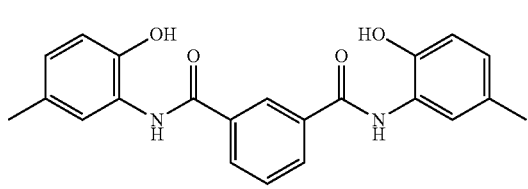

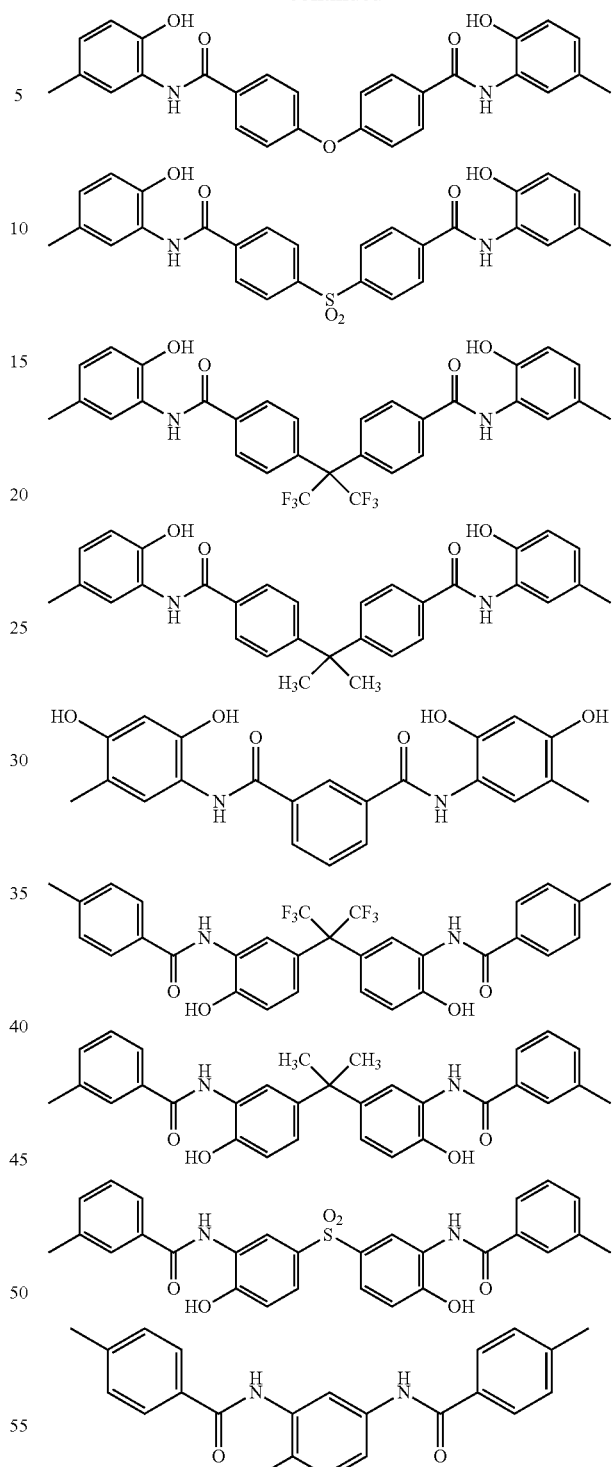

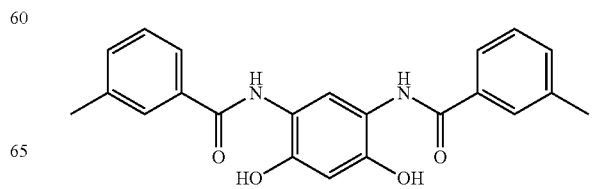

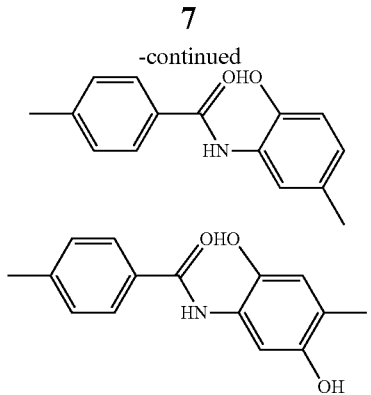

The structural unit (A) used in the present invention preferably comprises as $Y^1$ a diamine having a structural unit represented by the general formula (2):

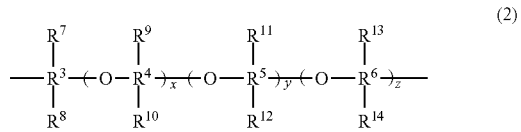

(wherein $R^3$ to $R^6$ each independently represent a $C_1$-$C_6$ alkylene group; $R^7$ to $R^{14}$ each independently represent a hydrogen atom, fluorine atom, or $C_1$-$C_6$ alkyl group; and x, y, and z each independently represent an integer number from 0 to 35, and wherein the structure indicated in each parenthesis is different each other).

Examples of the diamine having the structural unit represented by the general formula (2) include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), and 4,4'-methylene bis(2-methylcyclohexylamine); and KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700, (which are trade names; manufactured by HUNTSMAN Corporation), and the like, and diamines containing an alkylene-oxide structure are preferable in terms of increase in flexibility and enhancement of elongation. Moreover, the diamines may contain bonds such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH—, and the like.

When a cured film is formed, the ether group in the structural unit represented by the general formula (2), which contributes to the flexibility of the structure, can provide high elongation properties to the cured film. Moreover, the presence of the ether group allows complex formation with metal ions and/or hydrogen bond formation, which provides high adhesion to metals. The content of the polyether structural unit represented by the general formula (2) is preferably 5 to 40% by mole of the total diamine residues. The content is preferably not less than 5% by mole and more preferably not less than 10% by mole relative to the total diamine residues because such content can reduce the stress load on the obtained cured film and thereby suppress the increase of stress on a substrate wafer. Moreover, the content of the diamine having the structural unit represented by the general formula (2) is preferably not more than 40% by mole, more preferably not more than 30% by mole, and still more preferably not more than 20% by mole relative to the total diamine residues in order to maintain the solubility in an alkaline solution.

Moreover, if the molecular weight of the structural unit represented as $Y^1$ by the general formula (2) is not less than 150 in the alkali-soluble polyamide (A) used in the present invention and represented by the general formula (1) (hereinafter sometimes referred to as component (A) for short), the increase of stress on a substrate wafer, which is associated with thermal curing of the cured film, can be suppressed. In other words, the flexibility of the $Y^1$ can contribute to the relief of the stress and achieve a lowered stress. Moreover, incorporation of a flexible group having a low ultraviolet absorption property can simultaneously achieve a high i-line transmittance and sensitivity improvement. The molecular weight of the structural unit represented by the general formula (2) is preferably not less than 150, more preferably not less than 600, and still more preferably not less than 900. Moreover, the molecular weight is preferably not more than 2,000, more preferably not more than 1,800, and still more preferably not more than 1,500 in order to maintain the solubility in an alkaline solution. The molecular weight is more preferably not less than 600 and not more than 1,800, and still more preferably not less than 900 and not more than 1,500. This can achieve a lower stress and a higher sensitivity.

Moreover, among alkyl ethers, tetramethylene ether group is excellent in heat resistance. Because of this, the polyether structural unit represented by the general formula (2) preferably contains the tetramethylene ether glycol structural unit. The presence of the tetramethylene ether glycol structural unit can provide metal adhesion properties after a reliability test. The content of the tetramethylene ether glycol structural unit in the polyether structural unit represented by the general formula (2) is preferably not less than 50% by mole relative to the structural units represented by the general formula (2). All the polyether structural units may be tetramethylene ether glycol structural units. Examples include, but are not limited to, RT-1000, HE-1000, HT-1100, and HT-1700, (which are trade names; manufactured by HUNTSMAN Corporation), and the like.

The molecular weight of the component $Y^1$ in a resin based on the component (A) can be measured with respect to a diamine monomer containing the $Y^1$ structure by, for example, LC-MS and be determined as corresponding to a main signal.

Moreover, an aliphatic group having a siloxane structure may be provided for copolymerization to the extent that the heat resistance is not reduced, by which the adhesion to a substrate can be enhanced.

Specific examples include those produced by copolymerization with, as a diamine component, bis(3-aminopropyl)tetramethyldisiloxane, bis(p-aminophenyl)octamethylpentasiloxane, or the like in the ratio of 1 to 15% by mole. The copolymerization with 1% by mole or more of the diamine component will be preferable because it allows the enhancement of adhesion to a substrate such as silicon wafer, while the copolymerization with 15% by mole or less of the diamine component will be preferable because it allows the maintenance of solubility in an alkaline solution.

The component (A) according to the present invention preferably has a weight-average molecular weight of not less than 10,000 and not more than 50,000. The component (A) having a weight-average molecular weight of not less than 10,000 as determined in terms of polystyrene by GPC (gel permeation chromatography) can increase the crease resistance obtainable after curing. On the other hand, the component (A) having a weight-average molecular weight of not more than 50,000 can enhance the developing property with an alkaline solution. A weight-average molecular weight of not less than 20,000 is more preferable in order to provide mechanical properties. Moreover, when two or more alkali-soluble polyamides are contained, at least one of them should have a weight-average molecular weight in the above-described range.

Moreover, to increase the pot life of the positive photosensitive resin composition, capping the terminal of the component (A) with an end cap compound is preferable. Examples of the end cap compound include monoamines, acid anhydrides, monocarboxylic acids, monoacid chloride compounds, active monoester compounds, and the like. Moreover, by capping the termini of the resin with an end cap compound that contains a hydroxyl group, carboxyl group, sulfonic acid group, thiol group, vinyl group, ethynyl group, or allyl group, the dissolution rate of the resin in an alkaline solution and the mechanical properties of the resulting cured film can easily be adjusted to preferable ranges.

The ratio of the end cap compound to be introduced is preferably not less than 0.1% by mole and particularly preferably not less than 5% by mole relative to the total amine components in order to suppress a decrease in the solubility in an alkaline solution due to the increased molecular weight of the component (A). Moreover, the ratio of the end cap compound to be introduced is preferably not more than 60% by mole and particularly preferably not more than 50% by mole in order to prevent the resulting cured film from reducing the mechanical properties due to the decreased molecular weight of the resin containing the structural unit (A). Plural different terminal groups may be introduced by allowing multiple end cap compounds to react.

Preferable examples of the monoamines used for the end cap compounds include M-600, M-1000, M-2005, and M-2070 (which are trade names; manufactured by HUNTSMAN Corporation), and aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, and the like. Two or more of them may be used in combination.

Preferable examples of the acid anhydrides, monocarboxylic acids, monoacid chloride compounds, and active monoester compounds include: acid anhydrides, such as phthalic anhydride, maleic anhydride, nadic anhydride, cyclohexane dicarboxylic acid anhydride, and 3-hydroxyphthalic acid anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds produced by converting the carboxyl group of the respective compounds into an acid chloride; monoacid chloride compounds produced by converting one of the carboxyl groups in each of dicarboxylic acids, such as terephthalic acid, phthalic acid, maleic acid, cyclohexane dicarboxylic acid, 1,5-dicarboxynaphthalene, 1,6-dicarboxynaphthalene, 1,7-dicarboxynaphthalene, and 2,6-dicarboxynaphthalene, into an acid chloride; active ester compounds obtained by reaction of the respective monoacid chloride compounds with N-hydroxy-benzotriazole or -imidazole, or N-hydroxy-5-norbornene-2,3-dicarboximide; and the like. Two or more of them may be used in combination.

Moreover, an end cap compound introduced into the component (A) used in the present invention can be easily detected by the following methods. For example, an end cap compound used in the present invention can be easily detected by dissolving a resin, into which the end cap compound has been introduced, in an acidic solution to decompose the resin into an amine component and an acid anhydride component, which are the constituent units of the resin, followed by the measurement of these components by gas chromatography (GC) and/or NMR. Alternatively, an end cap compound can also be easily detected by directly analyzing a resin component, into which the end cap compound has been introduced, by the al decomposition gas chromatography (PGC) and/or infrared spectroscopy and $^{13}$C-NMR spectroscopy.

Moreover, the component (A) used in the present invention is polymerized using a solvent. The polymerization solvent is not limited to a particular type, provided that it can dissolve dicarboxylic acids, dicarboxylic acid derivatives, tetracarboxylic dianhydrides, and diamines, each of which is a raw material monomer. Examples of the polymerization solvent can include: amides, such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyramide, and methoxy-N,N-dimethylpropionamide; cyclic esters, such as γ-butyrolactone, γ-valerolactone, δ-valerolactone, γ-caprolactone, s-caprolactone, and α-methyl-γ-butyrolactone; carbonates, such as ethylene carbonate, and propylene carbonate; glycols, such as triethylene glycol; phenols, such as m-cresol and p-cresol; acetophenone, 1,3-dimethyl-2-imidazolidinone, sulfolane, dimethylsulfoxide, and the like.

The polymerization solvent used in the present invention is used preferably in an amount of not less than 100 parts by mass and more preferably not less than 150 parts by mass relative to 100 parts by mass of the resulting resin in order to dissolve the resin obtained after the reaction, while it is used preferably in an amount of not more than 1,900 parts by mass and more preferably not more than 950 parts by mass in order to obtain the resin as powder while collecting precipitates.

Moreover, the photosensitive resin composition of the present invention before curing is a positive photosensitive resin composition that contains the component (A), a compound (B) that generates an acid upon light exposure (hereinafter sometimes referred to as component (B) for short), and a heat-crosslinker (C). This positive photosensitive resin composition is not limited to a particular shape as long as it contains these components, but may be, for example, in the form of paste or sheet.

Moreover, the photosensitive sheet of the present invention refers to an incompletely cured sheet-shaped material, which is soluble in an alkaline aqueous solution and is produced by applying the photosensitive resin composition of the present invention onto a support and then drying it at a temperature and for a time period in the ranges with which the solvent is allowed to completely volatilize.

The support is not particularly limited, but usually commercially available various films, such as polyethylene terephthalate (PET) film, polyphenylenesulfide film, polyimide film, and the like, can be used. Surface treatment applied to the interface between the support and the photosensitive resin composition with a silicone, silane coupling agent, aluminum chelating agent, polyurea, or the like in order to enhance the adhesion and detachability. Moreover, the thickness of the support is not particularly limited, but it is preferably in the range of 10 to 100 µm from the viewpoint of usability. Furthermore, in order to protect the surface of a photosensitive composition film obtained by application of the photosensitive resin composition, the film may have a protective film on the surface. This can protect the surface of the photosensitive resin composition from pollutants such as dirt and dust in the atmosphere.

Examples of the method to apply the photosensitive resin composition onto a support include methods such as spin-coating using a spinner, spray coating, roll coating, screen printing, blade coater method, die coater method, calender coater method, meniscus coater method, bar coater method, roll coater method, comma roll coater method, gravure coater method, screen coater method, slit die coater method, and the like. Moreover, the thickness of the coated film varies depending on the coating technique, the solid content in the composition, the viscosity, and the like, but the thickness of the film after drying is usually preferred to be not less than 0.5 µm and not more than 100 µm.

For drying, an oven, a hot plate, infrared light, and the like can be used. The drying temperature and drying time should be in the ranges with which the solvent is allowed to completely volatilize, and they are preferably set as appropriate in the ranges with which the photosensitive resin composition is left uncured or semi-cured. Specifically, drying is preferably carried out in the range of 40° C. to 150° C. and for one to tens of minutes. Moreover, a combination of temperatures included in the temperature range may be used for temperature rising in a stepwise manner, and, for example, a heat treatment may be carried out at 80° C. and at 90° C., each for 2 minutes.

The positive photosensitive resin composition of the present invention before curing contains a compound that generates an acid upon light exposure, that is, a photosensitive material. The photosensitive material is a positive-type photosensitive material that is solubilized upon light exposure, and a quinonediazide compound or the like is preferably used as a photosensitive material. Examples of the quinonediazide compound include a polyhydroxy compound linked to a sulfonic acid group of a quinonediazide through an ester linkage, a polyamino compound linked to a sulfonic acid group of a quinonediazide through a sulfonamide linkage, a polyhydroxypolyamino compound linked to a sulfonic acid group of a quinonediazide through an ester linkage and/or a sulfonamide linkage, and the like. Not all the functional groups of the polyhydroxy compound, polyamino compound, and polyhydroxypolyamino compound may be substituted with quinonediazide, but 40% by mole or more of the total functional groups on average are preferably substituted with quinonediazide. By using such a quinonediazide compound, a positive photosensitive resin composition can be obtained, which is sensitive to i-line (wavelength: 365 nm), h-line (wavelength: 405 nm), and g-line (wavelength 436 nm) radiation from a mercury lamp, which are included in the standard ultraviolet rays.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene Tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (which are trade names; manufactured by Honshu Chemical Industry Co., Ltd.); and BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (which are trade names; manufactured by Asahi Organic Chemicals Industry Co., Ltd.); and 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, BisP-AP (trade name; manufactured by Honshu Chemical Industry Co., Ltd.), novolac resins, and the like.

Examples of the polyamino compound include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, 4,4'-diaminodiphenyl sulfide, and the like. Moreover, examples of the polyhydroxypolyamino compound include, but are not limited to, 2,2-bis(3-amino-4-hydroxyphenyl)hexafluoropropane, 3,3'-dihydroxybenzidine, and the like.

Among them, it is more preferable that the quinonediazide compound contains an ester between a phenol compound and the sulfonyl group of a 4-naphthoquinonediazide sulfonyl compound. This results in high sensitivity to i-line exposure and a higher resolution.

The content of the component (B) is preferably not less than 1 part by mass and more preferably not less than 10 parts by mass relative to 100 parts by mass of a resin containing the component (A), which achieves sufficient sensitivity after exposure to light. Moreover, the content of the quinonediazide compound is preferably not more than 50 parts by mass and more preferably not more than 40 parts by mass relative to 100 parts by mass of the component (A), which does not reduce film properties. It can be contemplated that a higher level of sensitivity as well as film properties of interest is achieved by specifying the content of the quinonediazide compound within this range. Furthermore, other photo acid generators such as onium salts and diaryl compounds, photo sensitizers, and the like may be added as necessary.

The positive photosensitive resin composition of the present invention before curing preferably contains a heat-crosslinker (C) (hereinafter sometimes referred to as component (C) for short). Specifically, a compound having at least two alkoxymethyl or methylol groups is preferable. The presence of at least these two groups can provide a cross-linked structure obtained through condensation of the resin and a similar molecule. Moreover, the combination use with the component (B) allows exploring a wider range of designs for the purpose of improving the sensitivity and/or the mechanical properties of a cured film.

Preferable examples of the component (C) include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (which are trade names; manufactured by Honshu Chemical Industry Co., Ltd.); and NIKALAC (registered trademark) MX-290, NIKALAC MX-280, NIKALAC MX-270, NIKALAC MX-279, NIKALAC MW-100LM, and NIKALAC MX-750LM (which are trade names; manufactured by Sanwa Chemical Co., Ltd.). Two or more of these may be contained. Among those, HMOM-TPHAP and MW-100LM are more preferable because the addition of them will prevent reflow from occurring during curing and provide high degree of rectangular shape of pattern.

The content of the component (C) is preferably not more than 40 parts by mass relative to 100 parts by mass of the component (A). The content in this range will allow exploring a wide range of designs in a more appropriate manner for the purpose of improving the sensitivity and/or the mechanical properties of a cured film. Moreover, a low molecular weight compound having a phenolic hydroxyl group may be contained as necessary to the extent that the residual film rate after shrinkage during curing is not decreased. This allows the developing time to be shortened.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylene Tris-FR-CR, and BisRS-26X (which are trade names; Honshu Chemical Industry Co., Ltd.); and BIP-PC, BIR-PC, BIR-PTBP, and BIR-BIPC-F (which are trade names; manufactured by Asahi Organic Chemicals Industry Co., Ltd.); and the like. Two or more of these may be contained. The low molecular weight compound having a phenolic hydroxyl group is preferably contained at a content of 1 to 40 parts by mass relative to 100 parts by mass of the component (A).

The photosensitive resin composition of the present invention before curing preferably contains a compound (D) represented by the general formula (3) (hereinafter sometimes referred to as component (D) for short). The presence of the component (D) significantly enhances the adhesion of a heat-cured film to metal materials, especially to copper. This enhanced adhesion is attributed to the efficient interaction of sulfur atom and/or nitrogen atom in the compound represented by the general formula (3) with the metal surface, and furthermore to the conformation of the compound which promotes the interaction with the metal surface. Based on these effects, a cured film excellent in adhesion to metal materials can be obtained from the positive photosensitive resin composition of the present invention. Examples of $R^{18}$ to $R^{20}$ in the general formula (3) include hydrogen atom, alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, combinations thereof, and the like, and they optionally contain a substituent.

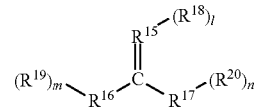

(in the general formula (3), $R^{15}$ to $R^{17}$ represent an oxygen, sulfur, or nitrogen atom, provided that at least one of $R^{15}$ to $R^{17}$ represents a sulfur atom; l is 0 or 1; m and n represent an integer number from 0 to 2; and $R^{18}$ to $R^{20}$ each independently represent a hydrogen atom or a $C_1$-$C_{20}$ organic group).

Moreover, the content of the component (D) is preferably 0.1 to 10 parts by mass relative to 100 parts by mass of the component (A). Preferably, the content of not less than 0.1 parts by mass can sufficiently provide an adhesive effect on metal materials, while, if the photosensitive resin composition used in the present invention is a positive photosensitive resin composition, the content of not more than 10 parts by mass can suppress a decrease in the sensitivity of the positive photosensitive resin composition before curing based on the interaction with the photosensitive material.

In the component (D) used in the present invention, $R^{15}$ to $R^{17}$ represent an oxygen, sulfur, or nitrogen atom, and at least one of $R^{15}$ to $R^{17}$ preferably represents a sulfur atom. In general, in cases where a compound containing a nitrogen atom is added, the interaction between the photosensitive material and the nitrogen-containing compound may reduce the sensitivity, while the presence of sulfur atom can lower the effect of the interaction with the photosensitive material, by which the enhancing effect on the adhesion can be obtained without reducing the sensitivity of the positive photosensitive resin composition before curing. Moreover, a trialkoxymethyl group is more preferably contained from the viewpoint of the adhesion to substrates other than metals.

Examples of the compound represented by the general formula (3) include, but are not limited to, the following structures.

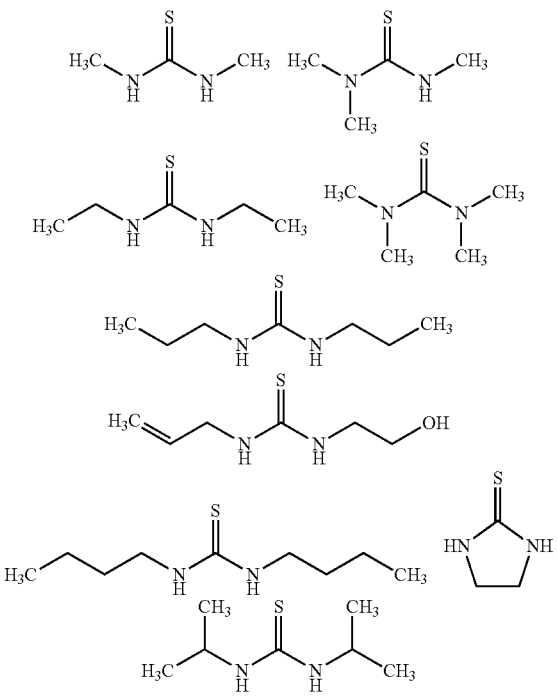

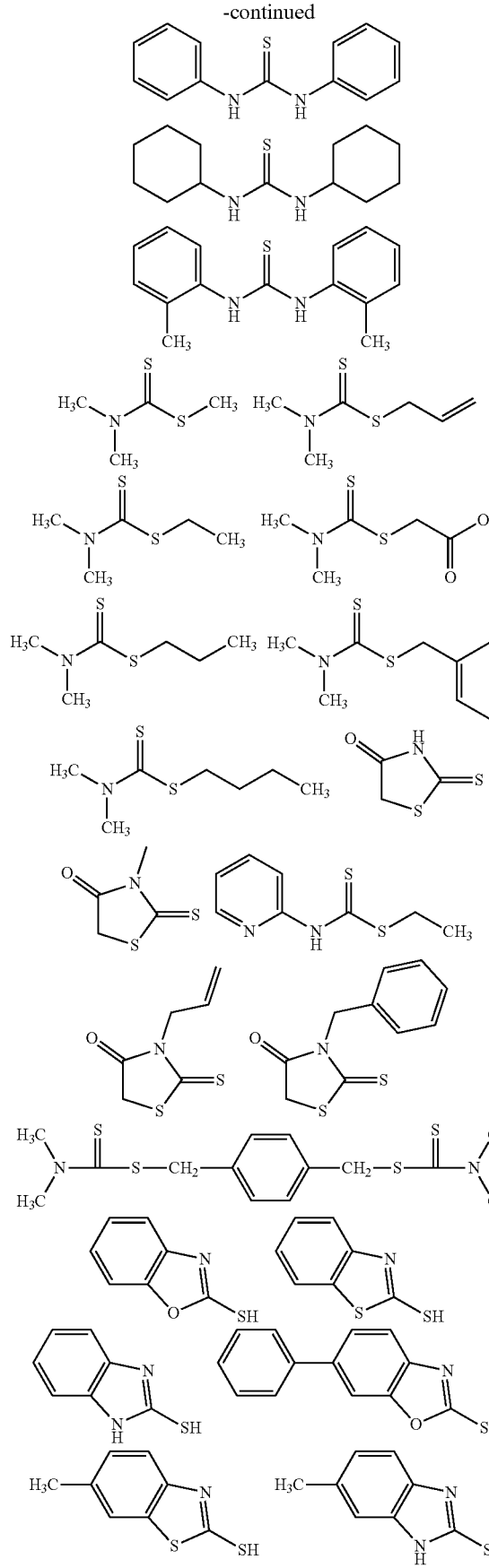
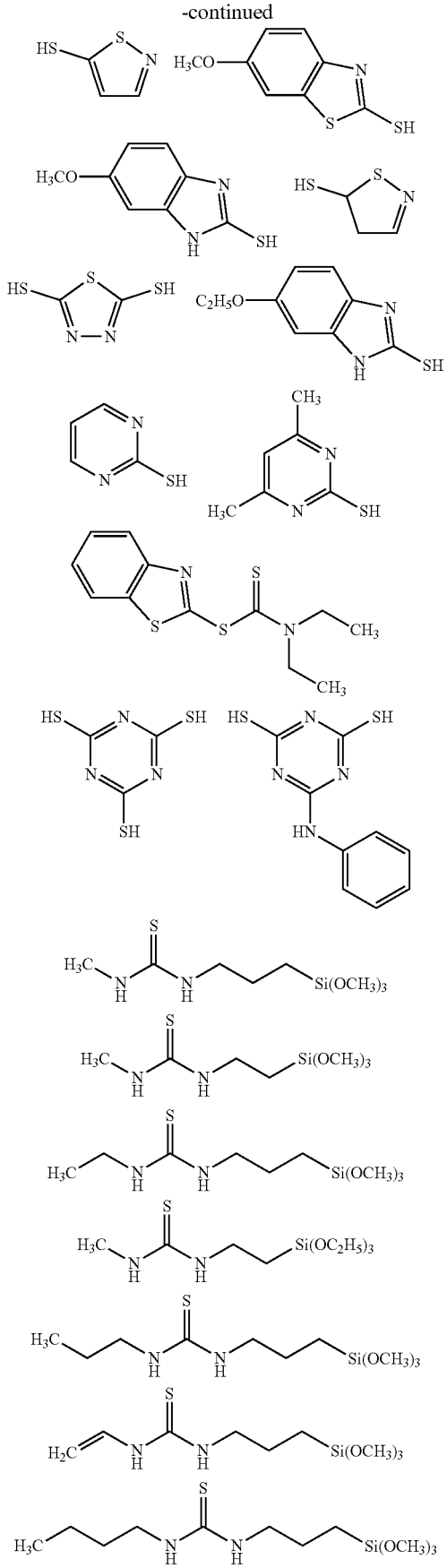

-continued

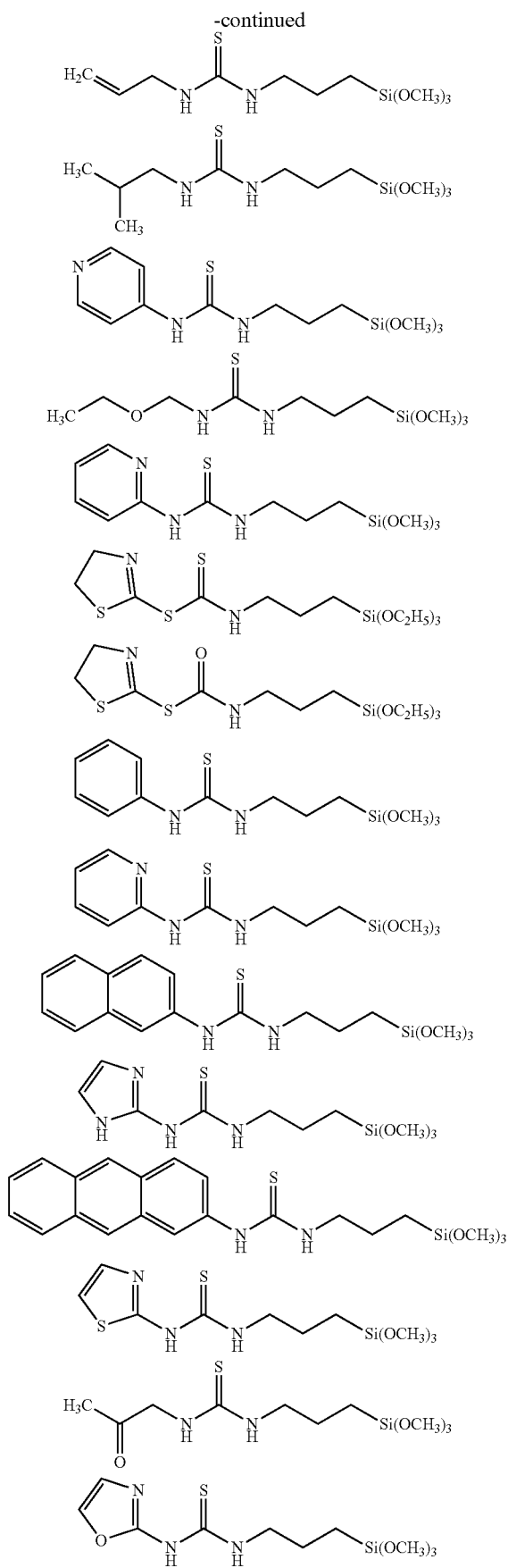

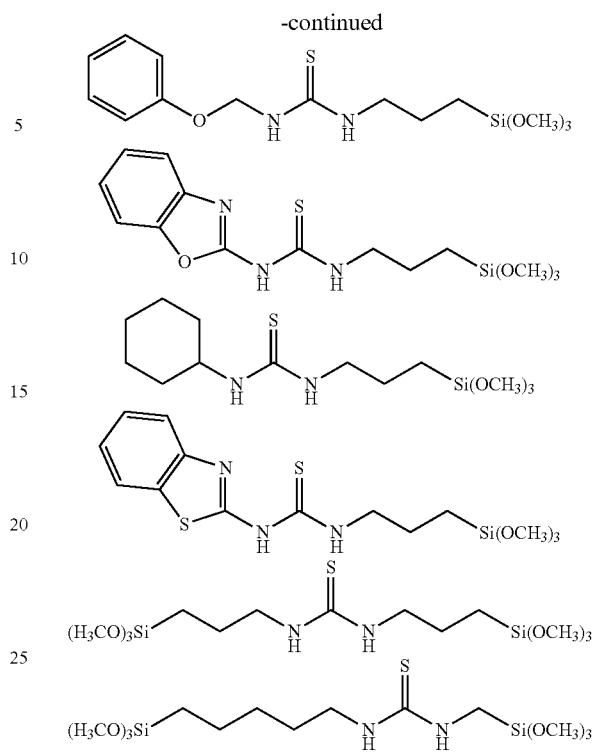

The positive photosensitive resin composition of the present invention before curing preferably contains a compound (E) represented by the general formula (4) below (hereinafter sometimes referred to as component (E) for short). The presence of the component (E) can suppress deterioration of the mechanical properties of a cured film after a reliability test and/or of the adhesion to metal materials.

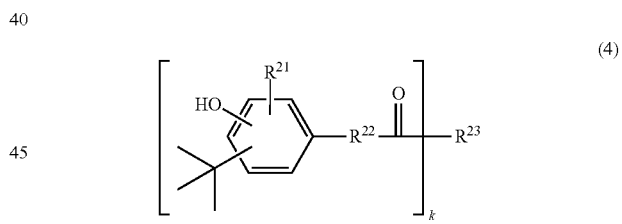

(in the general formula (4), $R^{21}$ represents a hydrogen atom or an alkyl group containing two or more carbon atoms; $R^{22}$ represents an alkylene group containing two or more carbon atoms; $R^{23}$ represents an organic group having one to four valences and comprising at least any of an alkylene group containing two or more carbon atoms, oxygen atom, and nitrogen atom; and k represents an integer number from 1 to 4).

The component (E) works as an antioxidant to suppress oxidative degradation of the aliphatic group and phenolic hydroxyl group of the component (A). Moreover, the rust preventing action on metal materials can inhibit oxidation of metal materials.

In the component (E) used in the present invention, $R^{21}$ represents a hydrogen atom or an alkyl group containing two or more carbon atoms, and $R^{22}$ represents an alkylene group containing two or more carbon atoms. $R^{23}$ represents an organic group having one to four valences and comprising at least any of an alkylene group containing two or more carbon atoms, oxygen atom, and nitrogen atom. k represents an integer number from 1 to 4. The component can interact with both the component (A) in a cured film and a metal material to enhance the adhesion of the cured film to the metal material. For a more efficient interaction with both the component (A) in a cured film and a metal material, k is more preferably an integer number from 2 to 4. Examples of R$^{23}$ include alkyl group, cycloalkyl group, aryl group, aryl ether group, carboxyl group, carbonyl group, allyl group, vinyl group, heterocyclic group, —O—, —NH—, —NHNH—, or combinations thereof, and the like, and they optionally contain a substituent. Among those, alkyl ether or —NH— is preferably contained in terms of the solubility in a developer solution and/or the adhesion to metals, while —NH— is more preferably contained in terms of the interaction with the component (A) and the adhesion to metals based on the formation of a metal complex.

Moreover, the content of the component (E) is preferably from 0.1 to 10 parts by mass and more preferably from 0.5 to 5 parts by mass relative to 100 parts by mass of the component (A). The content of not less than 0.1 parts by mass is preferable because it allows suppression of oxidative degradation of an aliphatic group and a phenolic hydroxyl group and, moreover, inhibition of oxidation of metal materials based on the rust preventing action on metal materials. Moreover, preferably, the content of not more than 10 parts by mass can suppress a decrease in the sensitivity of the positive photosensitive resin composition before curing, due to the interaction with photosensitive material. Examples of the component (E) include, but are not limited to, the following structures.

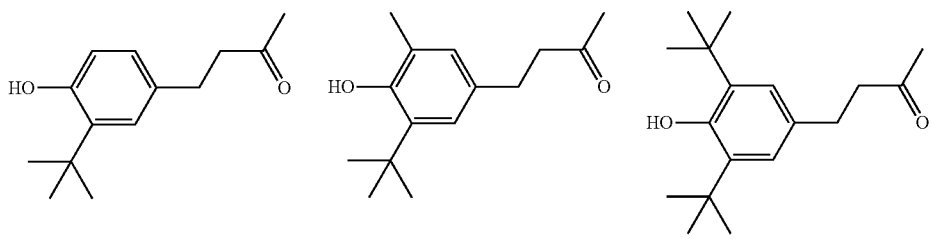

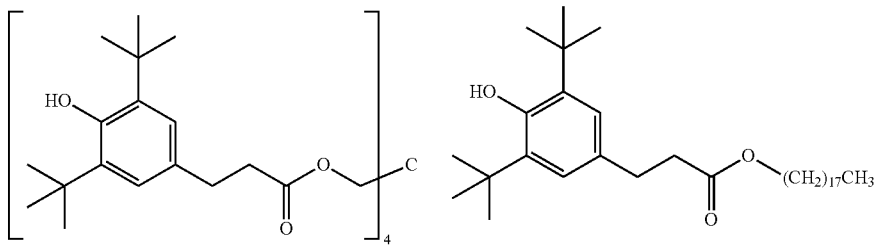

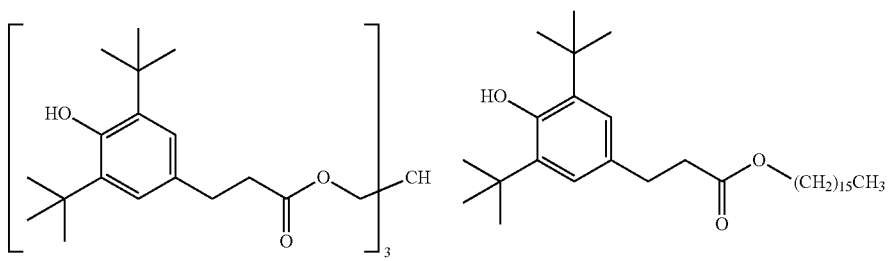

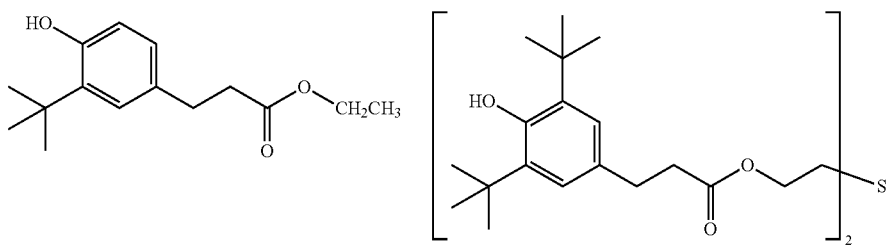

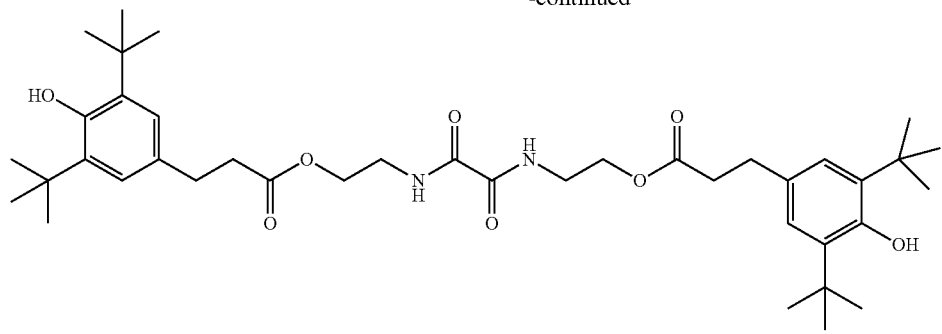
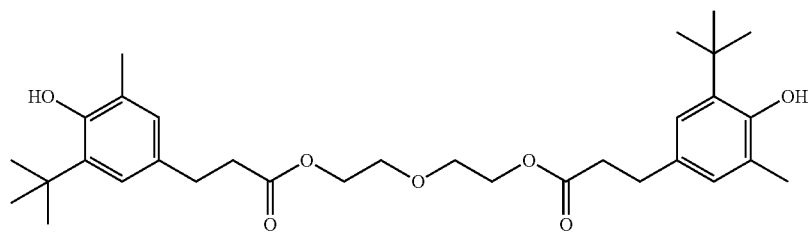
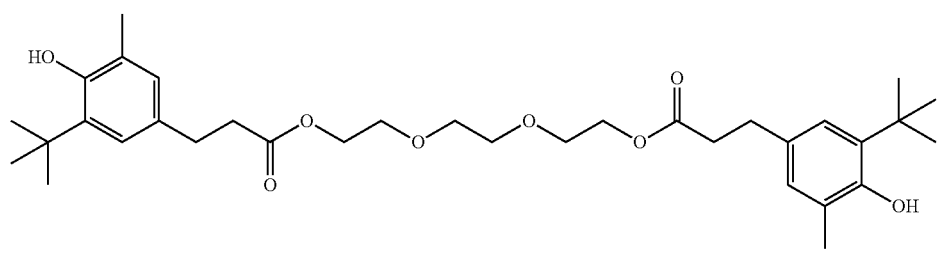
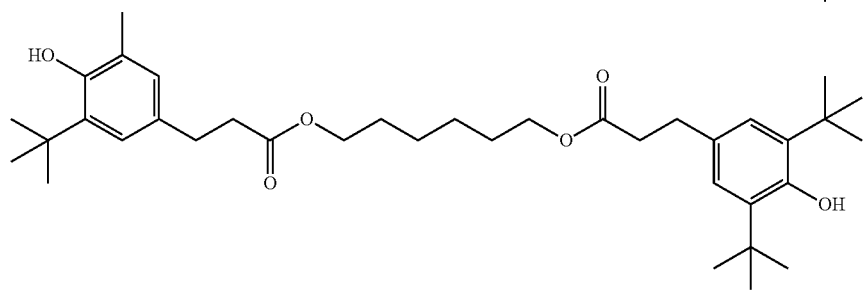
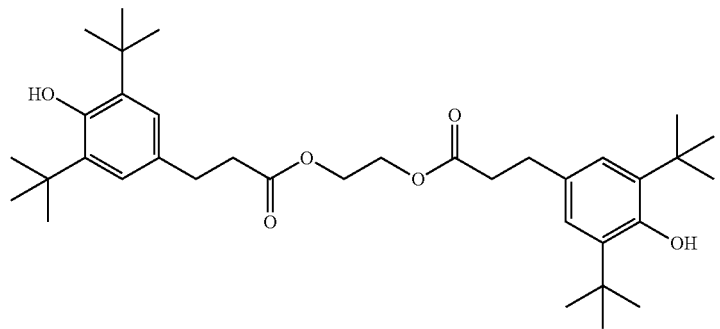

-continued
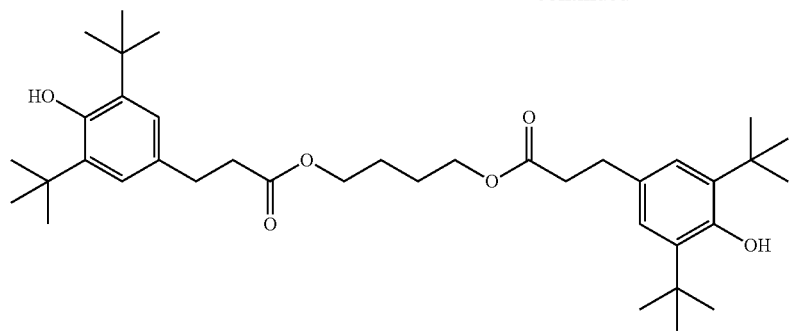
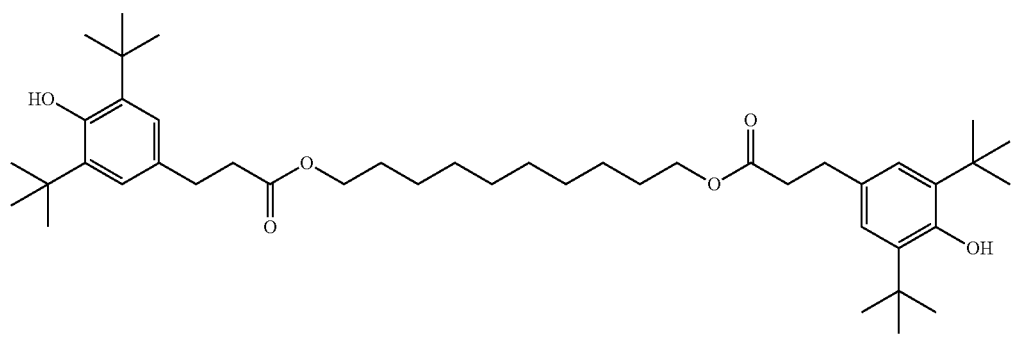
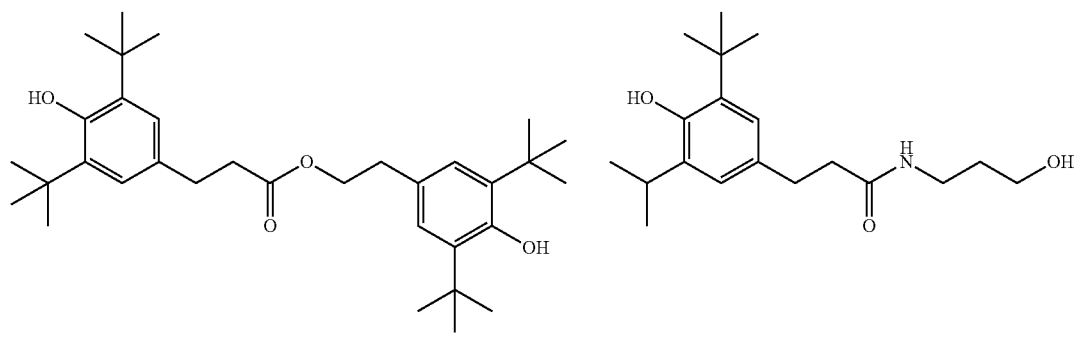
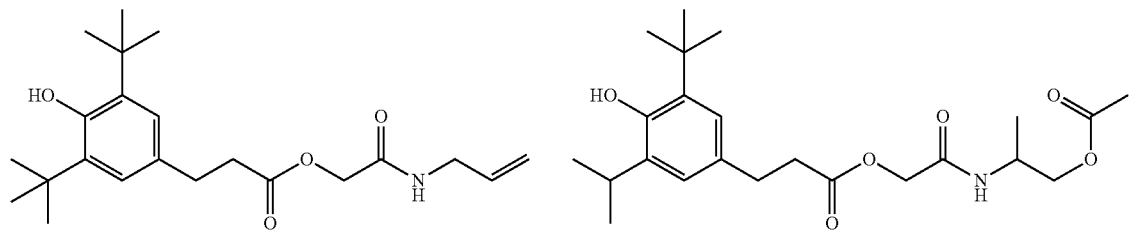
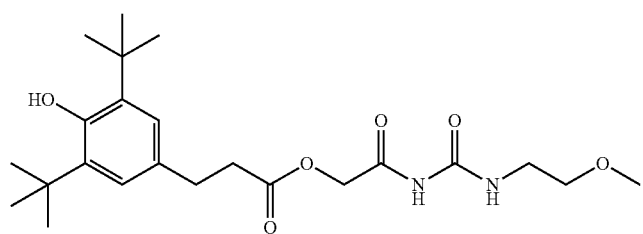

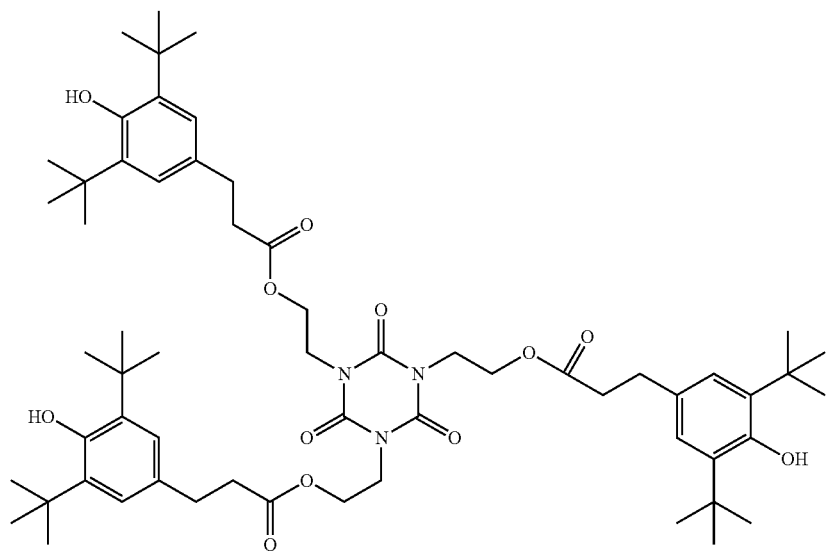
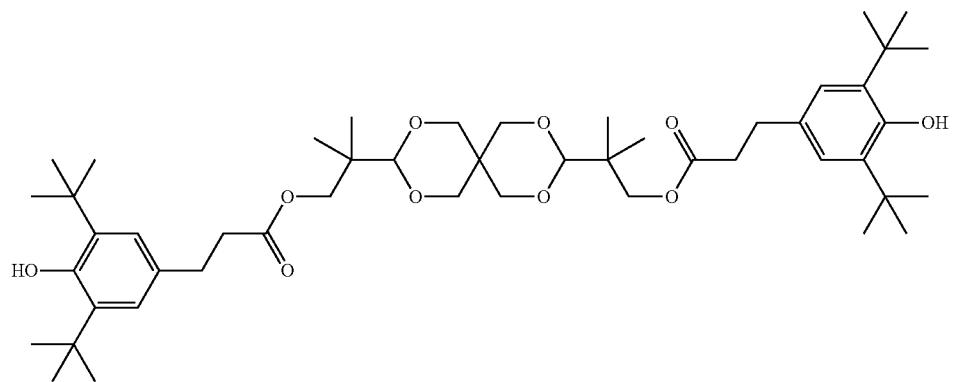
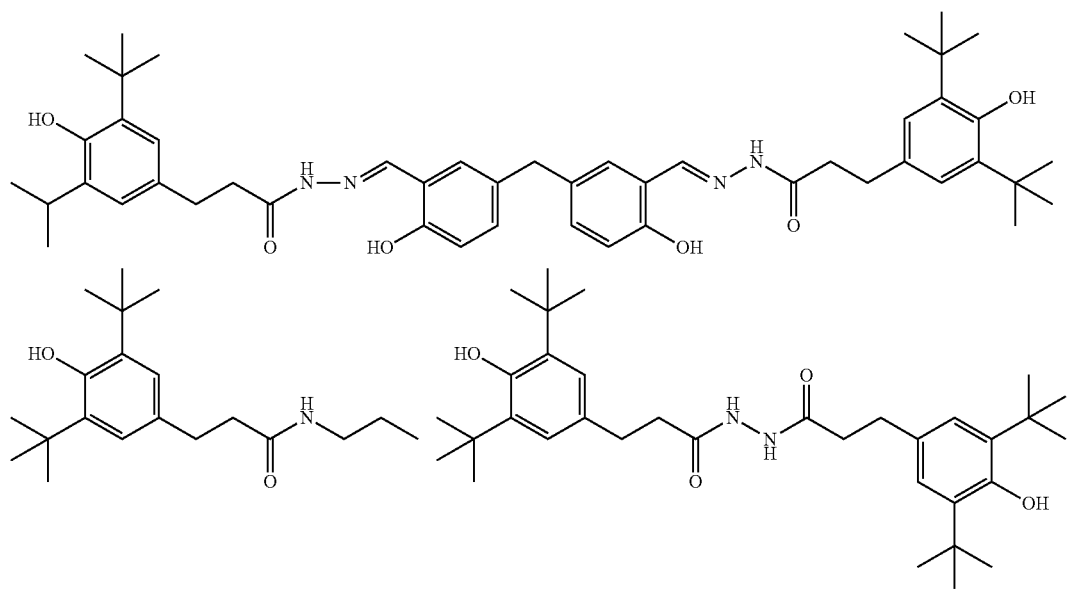

-continued
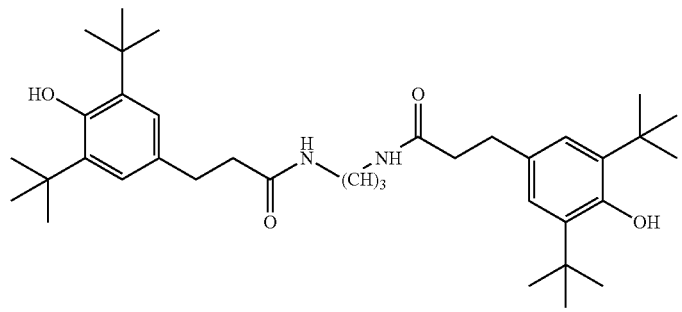
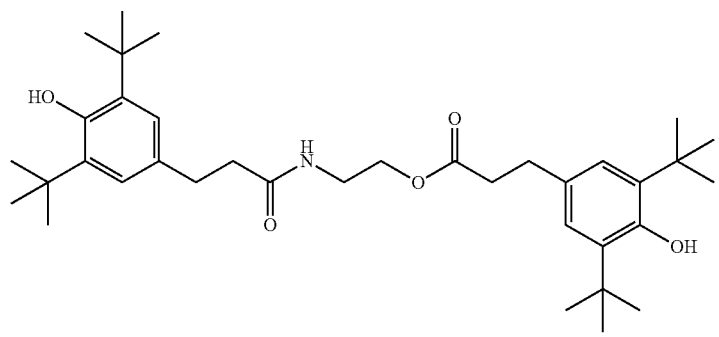
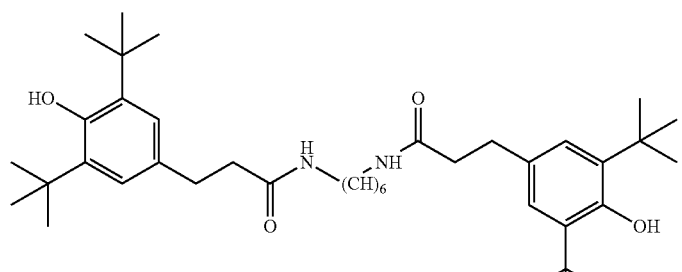
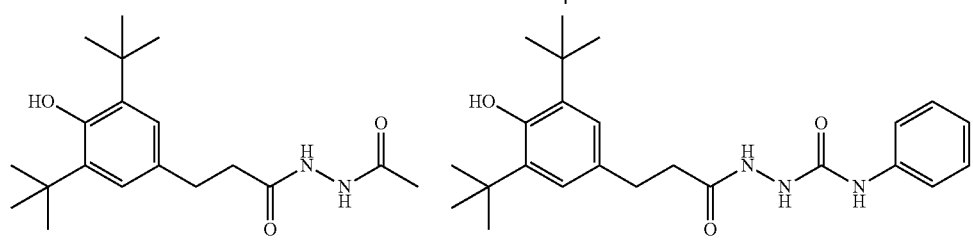
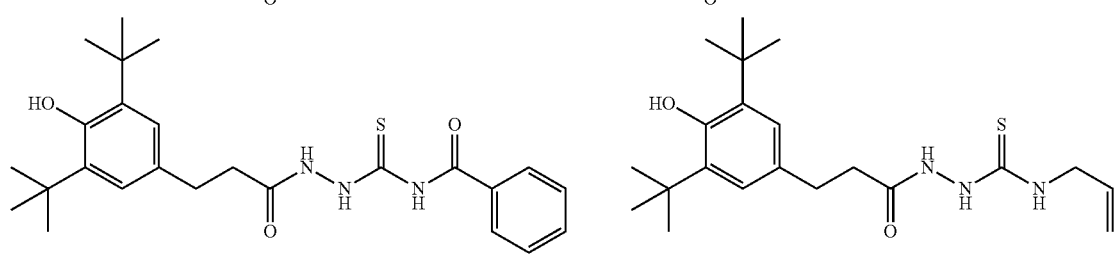

-continued

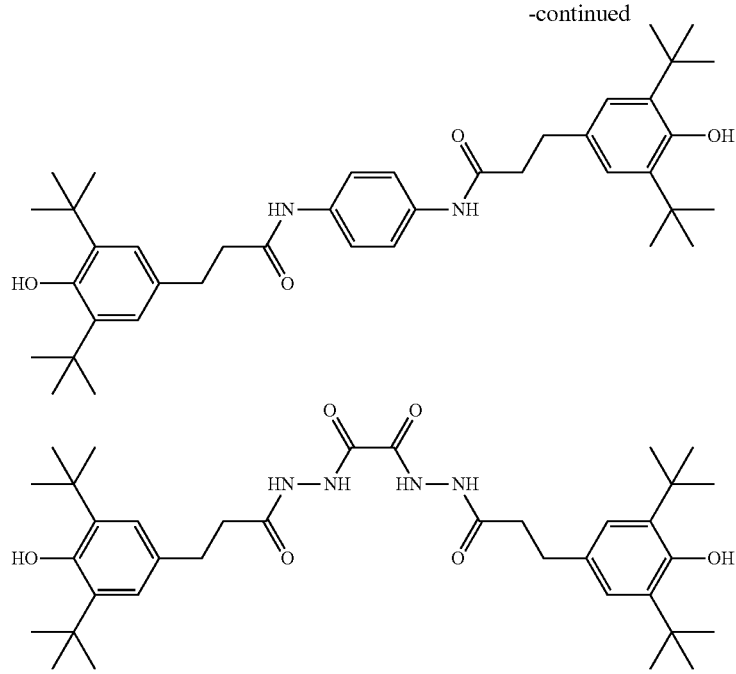

The positive photosensitive resin composition of the present invention before curing preferably contains a heat-crosslinker (F) having a structural unit represented by the general formula (5) (hereinafter sometimes referred to as component (F) for short). The presence of the component (F) allows further improvement of mechanical properties and reduction of stress to be achieved.

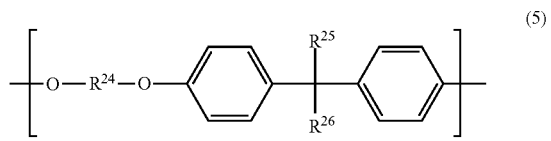

(in the general formula (5), $R^{25}$ and $R^{26}$ each independently represent a hydrogen atom or methyl group; and $R^{24}$ is a divalent organic group comprising an alkylene group containing two or more carbon atoms, which may be linear, branched, or cyclic).

In the component (F) used in the present invention, $R^{25}$ and $R^{26}$ each independently represent a hydrogen atom or methyl group. Moreover, $R^{24}$ is a divalent organic group comprising an alkylene group containing two or more carbon atoms, which may be linear, branched, or cyclic. Examples of $R^{24}$ include alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, combinations thereof, and the like, and they optionally contain a substituent.

Since the component (F) used in the present invention contains a flexible alkylene group and a rigid aromatic group, the component has a heat resistance and allows improvement of mechanical properties and reduction of stress in a cured film to be achieved. Examples of the crosslink group include, but are not limited to, acrylic group, methylol group, alkoxymethyl group, and epoxy group. Among those, epoxy group is preferable because it can react with the phenolic hydroxyl group of the component (A) to improve the heat resistance of a cured film and to prevent film shrinkage caused by dehydration, which reduces the stress generated on a substrate.

Examples of the component (F) used in the present invention include, but are not limited to, the compounds having following structures:

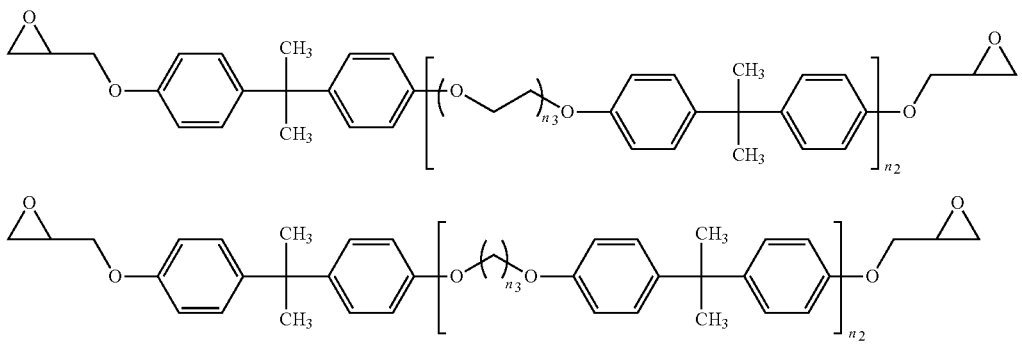

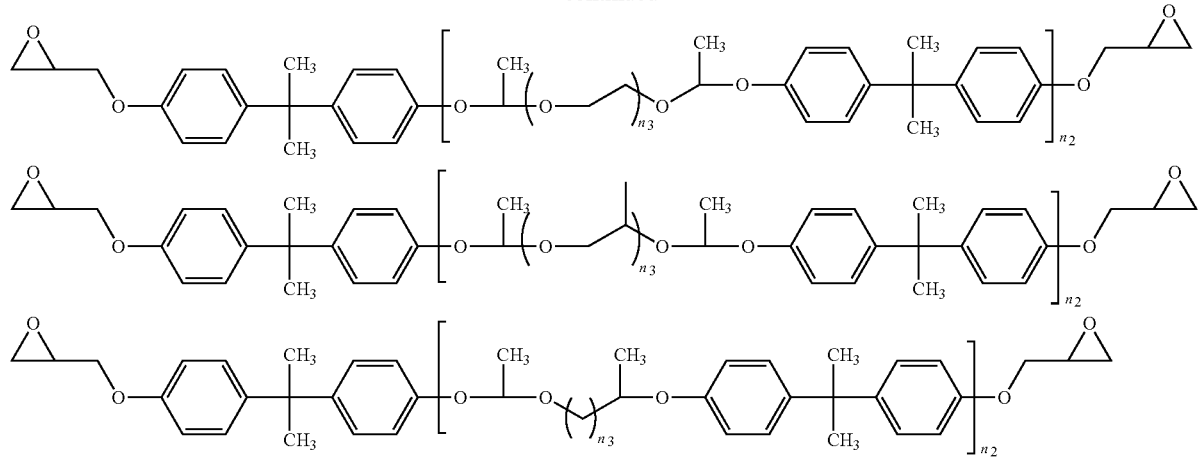

(wherein $n_2$ is an integer number from 1 to 5, and $n_3$ is an integer number from 1 to 20).

Among the structures described above, it is preferable for the component (F) used in the present invention to cope with the heat resistance and the mechanical properties that $n_2$ is from 1 to 2 and $n_3$ is from 3 to 7.

Moreover, the content of the component (F) is preferably from 2 to 35 parts by mass and more preferably from 5 to 25 parts by mass relative to 100 parts by mass of the component (A). The content of not less than 2 parts by mass can provide effects for improving mechanical properties and lowering the stress, while the content of not more than 35 parts by mass can suppress a decrease in the sensitivity of the positive photosensitive resin composition before curing.

Moreover, relative to 100 parts by mass of the component (F) used in the present invention, the content of the component (E) used in the present invention is preferably in the range of 10 parts by mass to 50 parts by mass. The content in this range will be able to suppress degradation of the alkylene group after a reliability test and thus to suppress deterioration of the mechanical properties of a cured film after a reliability test.

The positive photosensitive resin composition of the present invention before curing preferably contains a solvent. Examples of the solvent include: polar aprotic solvents, such as N-methyl-2-pyrrolidone, γ-butyrolactone, γ-valerolactone, γ-valerolactone, N,N-dimethylformamide, N,N-dimethylacetamide, dimethylsulfoxide, 1,3-dimethyl-2-imidazolidinone, N,N'-dimethylpropyleneurea, N,N-dimethylisobutyramide, and methoxy-N,N-dimethylpropionamide; ethers, such as tetrahydrofuran, dioxane, propylene glycol monomethyl ether, and propylene glycol monoethyl ether; ketones, such as acetone, methyl ethyl ketone, and diisobutyl ketone; esters, such as ethyl acetate, butyl acetate, isobutyl acetate, propyl acetate, propylene glycol monomethyl ether acetate, and 3-methyl-3-methoxybutyl acetate; alcohols, such as ethyl lactate, methyl lactate, diacetone alcohol, and 3-methyl-3-methoxybutanol; aromatic hydrocarbons, such as toluene and xylene; and the like. Two or more of these may be contained.

Relative to 100 parts by mass of the component (A), the content of the solvent is preferably not less than 100 parts by mass to dissolve the composition, while it is preferably not more than 1,500 parts by mass to form a coated film having a film thickness of 1 μm or more.

A cured film formed by curing the positive photosensitive resin composition of the present invention may contain, as needed, surfactants; esters, such as ethyl lactate and propylene glycol monomethyl ether acetate; alcohols, such as ethanol; ketones, such as cyclohexanone and methyl isobutyl ketone; and ethers, such as tetrahydrofuran and dioxane, for the purpose of improving the wettability with a substrate.

Moreover, in order to enhance adhesion to a substrate, a cured film formed by curing the positive photosensitive resin composition of the present invention may contain, as a silicon component, a silane coupling agent such as trimethoxyaminopropylsilane, trimethoxyepoxysilane, trimethoxyvinylsilane, trimethoxythiolpropylsilane, or the like, to the extent that the pot life is not compromised. The content of the silane coupling agent is preferably from 0.01 to 5 parts by mass relative to 100 parts by mass of the component (A).

A cured film formed by curing the positive photosensitive resin composition of the present invention may contain an alkali-soluble resin other than the component (A). Specific examples include alkali-soluble polyimides, polybenzoxazoles, acrylic polymers obtained by copolymerization of an acrylic acid, novolac resins, siloxane resins, and the like. Such resins are soluble in an alkaline solution such as tetramethylammonium hydroxide, choline, triethylamine, dimethylaminopyridine, monoethanolamine, diethylaminoethanol, sodium hydroxide, potassium hydroxide, sodium carbonate, or the like. The presence of any of these alkali-soluble resins can provide a cured film with the properties of each alkali-soluble resin while maintaining the adhesion property and excellent sensitivity of the cured film.

The viscosity of the positive photosensitive resin composition of the present invention before curing is preferably from 2 to 5,000 mPa·s. By adjusting the solid content to give a viscosity of not less than 2 mPa·s, a desired film thickness is easily obtained. On the other hand, the viscosity of not more than 5,000 mPa·s will facilitate obtaining a coated film of highly uniform thickness. A positive photosensitive resin composition having such a viscosity can easily be obtained by adjusting the solid content, for example, to 5 to 60% by mass.

Moreover, the component (A) in a cured film formed by curing the photosensitive resin composition used in the present invention may be copolymerized with another structure such as polyimide, as long as the structure contains the polyhydroxyamide structural unit represented by the general formula (1). Examples of the monomer to be copolymerized include, as an acid dianhydride, pyromellitic dianhydride, 2,3,5,6-pyridinetetracarboxylic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, 2,2-bis[4-(3,4-dicarboxyphenoxy)phenyl]propane dianhydride, 2,2-bis[4-(2,3-dicarboxyphenoxy)phenyl]propane dianhydride, 2,2-bis[4-(3,4-dicarboxyphenoxy)phenyl]sulfone dianhydride, 1,2,5,6-naphthalenetetracarboxylic acid dianhydride, 1,4,5,8-naphthalenetetracarboxylic acid dianhydride, 2,3,6,7-naphthalenetetracarboxylic acid dianhydride, 2,3,6,7-naphthalenetetracarboxylic acid dianhydride, 3,4,9,10-perylenetetracarboxylic dianhydride, p-phenylene bis(trimellitic acid monoester dianhydride), p-biphenylene bis(trimellitic acid monoester dianhydride), ethylene bis(trimellitic acid monoester dianhydride), bisphenol A bis(trimellitic acid monoester dianhydride), butanetetracarboxylic dianhydride, cyclobutanetetracarboxylic dianhydride, 1,2,3,4-cyclopentanetetracarboxylic dianhydride, 1,2,4,5-cyclohexanetetracarboxylic dianhydride, bicyclo[2.2.1.]heptanetetracarboxylic dianhydride, bicyclo[3.3.1.]tetracarboxylic dianhydride, bicyclo[3.1.1.]hept-2-ene tetracarboxylic dianhydride, bicyclo[2.2.2.]octanetetracarboxylic dianhydride, adamantane-tetracarboxylic acid, 4,4'-(fluorenyl)diphthalic anhydride, 3,4'-oxydiphthalic anhydride, 4,4'-oxydiphthalic anhydride, 4,4'-(hexafluoroisopylidene)diphthalic anhydride, and the like.

Examples of the diamine include, but are not limited to, m-phenylenediamine, p-phenylenediamine, 3,5-diaminobenzoic acid, 1,5-naphthalenediamine, 2,6-naphthalenediamine, 9,10-anthracenediamine, 2,7-diaminofluorene, 4,4'-diaminobenzanilide, 3,4'-diaminodiphenylether, 4,4'-diaminodiphenyl ether, 3-carboxy-4,4'-diaminod- iphenylether, 3-sulfonic acid-4,4'-diaminodiphenylether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminobiphenyl sulfide, 4,4'-diaminodiphenyl sulfide, 4-aminobenzoic acid 4-aminophenyl ester, 9,9-bis(4-aminophenyl)fluorene, 1,3-bis(4-aniliono)tetramethyldisiloxane, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, bis(4-aminophenoxyphenyl)sulfone, bis(3-aminophenoxyphenyl)sulfone, bis(4-aminophenoxy)biphenyl, bis[4-(4-aminophenoxy)phenyl] ether, 2,2-bis[4-(4-aminophenoxy)phenyl]propane, 2,2-bis[4-(4-aminophenoxy)phenyl]hexafluoropropane, 1,4-bis(4-aminophenoxy)benzene, 1,3-bis(3-aminophenoxy)benzene, 1,3-bis(4-aminophenoxy)benzene, bis(3-amino-4-hydroxyphenyl) sulfone, bis(3-amino-4-hydroxyphenyl)propane, bis(3-amino-4-hydroxyphenyl)hexafluoropropane, bis(3-amino-4-hydroxyphenyl)methylene, bis(3-amino-4-hydroxyphenyl)ether, bis(3-amino-4-hydroxy)biphenyl, 4,4'-diamino-6,6'-bis(trifluoromethyl)-[1,1'-biphenyl]-3,3'-diol, 9,9-bis(3-amino-4-hydroxyphenyl)fluorene, 2,2'-bis[N-(3-aminobenzoyl)-3-amino-4-hydroxyphenyl]propane, 2,2'-bis[N-(3-aminobenzoyl)-3-amino-4-hydroxyphenyl]hexafluoropropane, 2,2'-bis[N-(4-aminobenzoyl)-3-amino-4-hydroxyphenyl]propane, 2,2'-bis[N-(4-aminobenzoyl)-3-amino-4-hydroxyphenyl]hexafluoropropane, bis[N-(3-aminobenzoyl)-3-amino-4-hydroxyphenyl]sulfone, bis[N-(4-aminobenzoyl)-3-amino-4-hydroxyphenyl]sulfone, 9,9-bis[N-(3-aminobenzoyl)-3-amino-4-hydroxyphenyl]fluorene, 9,9-bis[N-(4-aminobenzoyl)-3-amino-4-hydroxyphenyl]fluorene, N,N'-bis(3-aminobenzoyl)-2,5-diamino-1,4-dihydroxybenzene, N,N'-bis(4-aminobenzoyl)-2,5-diamino-1,4-dihydroxybenzene, N,N'-bis(4-aminobenzoyl)-4,4'-diamino-3,3-dihydroxybiphenyl, N,N'-bis(3-aminobenzoyl)-3,3'-diamino-4,4-dihydroxybiphenyl, N,N'-bis(4-aminobenzoyl)-3,3'-diamino-4,4-dihydroxybiphenyl, 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 1,4-bis(5-amino-2-benzoxazolyl)benzene, 1,4-bis(6-amino-2-benzoxazolyl)benzene, 1,3-bis(5-amino-2-benzoxazolyl)benzene, 1,3-bis(6-amino-2-benzoxazolyl)benzene, 2,6-bis(4-aminophenyl)benzobisoxazole, 2,6-bis(3-aminophenyl)benzobisoxazole, bis[(3-aminophenyl)-5-benzoxazolyl], bis[(4-aminophenyl)-5-benzoxazolyl], bis[(3-aminophenyl)-6-benzoxazolyl], bis[(4-aminophenyl)-6-benzoxazolyl], and the like. Two or more of them may be used in combination.

The polyhydroxyamide is preferably a poly(o-hydroxyamide) and, in this case, the rate of ring-closure of the poly(o-hydroxyamide) structural unit is preferably not less than 0.1% and not more than 10%. The use of a poly(o-hydroxyamide) having a rate of ring-closure within this range is preferable because it provides a sufficient concentration of hydroxyl group to be solubilized in an alkaline solution, as well as causes a steric hindrance to reduce intermolecular interactions and thus to provide a cured film of high elongation.

Subsequently, a method of fainting a heat-resistant resin pattern is exemplified, in which the photosensitive resin composition of the present invention before curing is used.

The photosensitive resin composition of the present invention before curing is applied onto a substrate. Examples of the substrate to be used include, but are not limited to, silicon wafer, ceramics, gallium arsenide, and the like. Examples of the method for application include methods such as spin-coating using a spinner, spray coating, roll coating, and the like. Moreover, the thickness of the coated film varies depending on the coating technique, the solid content in the composition, the viscosity, and the like, but the composition is usually applied such that the thickness of the film after drying is from 0.1 to 150 µm.

In order to enhance the adhesion between a substrate, such as silicon wafer, and the photosensitive resin composition, the substrate can also be subjected to a pre-treatment with the above-described silane coupling agent. For example, a surface treatment is carried out by spin-coating, dipping, spray coating, vaper treatment, or the like with a silane coupling agent dissolved in a solvent, such as isopropanol, ethanol, methanol, water, tetrahydrofuran, propylene glycol monomethyl ether acetate, propylene glycol monomethyl ether, ethyl lactate, or diethyl adipate, to a concentration of 0.5 to 20% by mass. In some cases, a heat treatment up to 50-300° C. is subsequently carried out to promote the reaction between the substrate and the silane coupling agent.

Then, the substrate coated with the photosensitive resin composition is dried to obtain a photosensitive resin composition film. For drying, an oven, hot plate, infrared light, or the like is preferably used at a temperature in the range of 50° C. to 150° C. for one minute to several hours.

Then, this photosensitive resin composition film is exposed to actinic irradiation through a mask of a desired pattern. Examples of the actinic rays used for the exposure include ultraviolet rays, visible rays, electron beams, X-rays, and the like. In the present invention, i-line (365 nm), h-line (405 nm), or g-line (436 nm) radiation from a mercury lamp is preferably used.

After the exposure, the exposed portion is removed for forming a resin pattern by using a developer solution. Examples of a preferable developer solution include alkaline solutions of compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine, and the like. In some cases, these alkaline solutions may be supplemented with a single kind of, or a combination of several kinds of, polar solvents such as N-methyl-2-pyrrolidone, N,N-dimethylformamide, N,N-dimethylacetamide, dimethylsulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutylketones, and methyl isobutyl ketone; and the like. After development, a rinse treatment is preferably carried out with water. Here, alcohols such as ethanol and isopropyl alcohol; esters such as ethyl lactate and propylene glycol monomethyl ether acetate; and the like may also be added to water for use in the rinse treatment.

After development, a thermal crosslinking reaction is promoted by applying a temperature of 150° C. to 250° C. to improve heat resistance and chemical resistance. This heat treatment is carried out for 5 minutes to 5 hours by first choosing temperatures and then increasing temperature in a stepwise manner, or by first choosing a certain temperature range and then continuously increasing temperature in the range. As one example, a heat treatment is carried out at 130° C. and at 200° C., each for 30 minutes. In the present invention, the lower temperature limit of the curing conditions is preferably not lower than 170° C. and more preferably not lower than 180° C. to sufficiently promote curing. Moreover, the upper temperature limit of the curing conditions is preferably not higher than 250° C. and more preferably not higher than 220° C. because the present invention provides a cured film exhibiting an excellent curability especially at a low temperature.

A heat-resistant resin film produced from the photosensitive resin composition of the present invention can be used in electronic components such as semiconductor devices and multilayer wiring boards. Specifically, the heat-resistant resin film is suitably used for applications including, but not limited to, passivation films for semiconductors, surface protection films for semiconductor devices, interlayer insulating films for semiconductor devices, interlayer insulating films for multilayer wiring for high-density mounting, insulating layers for organic electroluminescent devices, and the like, and can be used in various structures.

Subsequently, examples of the use of a cured film formed by curing the photosensitive resin composition of the present invention is exemplified by way of drawings, in which the cured film is applied to a semiconductor device having a bump. FIG. 1 is an enlarged cross-sectional view of a pad portion of a semiconductor device of the present invention having a bump. As illustrated in FIG. 1, a passivation film 3 is formed on an aluminium (hereinafter referred to as Al for short) pad 2 for input/output on a silicon wafer 1, and a via-hole is formed on the passivation film 3. Further on this film, an insulating film 4 is faulted into a pattern that is made of a cured film formed by curing the photosensitive resin composition of the present invention, and further on this film, a metal film (Cr, Ti, or the like) 5 is formed so as to be connected with the Al pad 2, and a metal line (Al, Cu, or the like) 6 is formed by electroplating or the like. By etching the metal film 5 around a solder bump 10, insulation is established between successive pads. On the insulated pad, a barrier metal 8 and the solder bump 10 are formed. An insulating film 7 of a cured film formed by curing the photosensitive resin composition can undergo thick film processing at a scribe line 9. In cases where a flexible component is introduced in the cured film formed by curing the photosensitive resin composition, the warpage of the resulting wafer is small and, hence, light exposure and wafer transfer can be carried out with high precision. Moreover, because the resin of the present invention also has excellent mechanical properties, the stress from the molding resin can also be released while the resin of the present invention is mounted, and thus any damage to the low-k layer can be prevented and semiconductor devices of high reliability can be provided.

Figure 2:
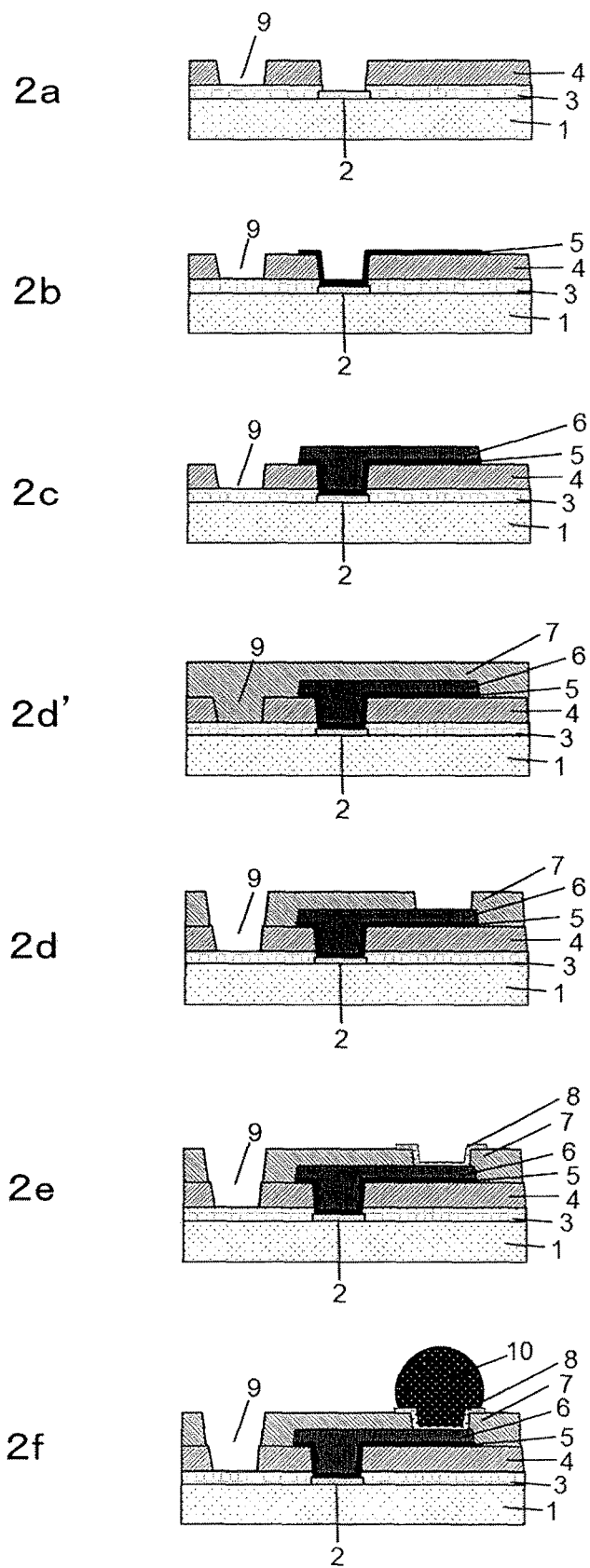
FIG. 2 depicts a detailed method of producing a semiconductor device having a bump.

Subsequently, a method of manufacturing a semiconductor device will be exemplified in detail in FIG. 2. As illustrated in 2a in FIG. 2, on a silicon wafer 1, an Al pad 2 for input/output and then a passivation film 3 are formed, and an insulating film 4 is then formed into a pattern that is made of a cured film formed by curing the photosensitive resin composition of the present invention. Subsequently, as illustrated in 2b in FIG. 2, a metal film (Cr, Ti, or the like) 5 is formed so as to be connected with the Al pad 2, and a metal line 6 is formed as illustrated in 2c in FIG. 2 by film deposition based on a plating method. Then, the photosensitive resin composition of the present invention before curing is applied as illustrated in 2d' in FIG. 2 and an insulating film 7 as a pattern as shown in 2d in FIG. 2 is fainted through a photolithography process. During this step, the photosensitive resin composition for the insulating film 7 before curing undergoes thick film processing at a scribe line 9. In case of forming a multilayer wiring structure comprising three or more layers, the above-described steps can be repeated to form each layer.

Subsequently, as illustrated in 2e and 2f in FIG. 2, a barrier metal 8 and a solder bump 10 are formed. Then, the structure is diced along the last scribe line 9 to separate individual chips. In cases where the insulating film 7 has no pattern along the scribe line 9 or residues are left there, cracks and the like are generated during dicing, which influence the reliability test of the chips. Because of this, the capability of providing a patterning process including an excellent thick film process, as in the present invention, is highly desirable for achieving high reliability in semiconductor devices.

EXAMPLES

Hereafter, by showing Examples, the present invention is intelligibly explained, but the scope of the present invention is not limited thereto. First, evaluation procedures in the respective Examples and Comparative Examples are described. A photosensitive resin composition before curing (hereinafter referred to as varnish) was preliminarily filtered through a polytetrafluoroethylene filter having a pore size of 1 μm (manufactured by Sumitomo Electric Industries, Ltd.) before using for evaluation.

(1) Measurement of Molecular Weight

The weight-average molecular weight (Mw) of a resin containing the structural unit (A) was confirmed using the GPC (gel permeation chromatography) machine Waters 2690-996 (manufactured by Nihon Waters K.K.). Measurement was carried out using N-methyl-2-pyrrolidone (hereinafter referred to as NMP) as a developing solvent to calculate the weight-average molecular weight (Mw) and the dispersity (PDI=Mw/Mn) in terms of polystyrene.

(2) Evaluation of Low Stress Property (Stress)

The varnish was applied onto a silicon wafer by a spin-coating method using the coating/developing machine ACT-8 such that the varnish would have a film thickness of 10 μm after prebaking at 120° C. for 3 minutes, and was prebaked, followed by a heat treatment using the inert oven CLH-21CD-S, in which the temperature was increased to 220° C. at a temperature rising rate of 3.5° C./min and then held constant at 220° C. for one hour at an oxygen concentration of not higher than 20 ppm under nitrogen gas flow. Upon reaching a temperature of not higher than 50° C., the silicon wafer was taken out and the cured film was measured on a stress measurement system FLX2908 (manufactured by KLA-Tencor Corporation). Based on the results, a cured film having a stress of 30 MPa or more was evaluated as poor and scored 1, a cured film having a stress of 20 MPa or more and less than 30 MPa was evaluated as good and scored 2, and a cured film having a stress of less than 20 MPa was evaluated as very good and scored 3.

(3) Evaluation of High Elongation Property (Elongation at Break)

The varnish was applied onto an eight-inch silicon wafer by a spin-coating method using the coating/developing machine ACT-8 such that the varnish would have a film thickness of 11 μm after prebaking at 120° C. for 3 minutes, and was prebaked, followed by a heat treatment using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the silicon wafer was taken out and dipped in 45% by mass hydrofluoric acid for 5 minutes to peel off a cured resin composition film from the wafer. This film was cut into 1 cm wide and 9 cm long strips and measured for elongation at break using the Tensilon RTM-100 (manufactured by Orientec Co., Ltd.) by pulling the strips at a traction speed of 5 mm/min and at a room temperature of 23.0° C. and a humidity of 45.0% RH. Ten strips per specimen were measured and elongation at break was determined as the arithmetic average value of the top five results. A cured film having an elongation at break of 60% or more was evaluated as very good and scored 4, a cured film having an elongation at break of 20% or more and less than 60% was evaluated as good and scored 3, a cured film having an elongation at break of 10% or more and less than 20% was evaluated as acceptable and scored 2, and a cured film having an elongation at break of less than 10% was evaluated as poor and scored 1.

(4) Evaluation of Adhesion

The adhesion to metal copper was evaluated by the following procedures. First, the varnish was applied onto a copper-plated substrate having a thickness of about 3 μm by a spin-coating method using a spinner (manufactured by Mikasa Co., Ltd.) and then baked on a hot plate (D-SPIN; manufactured by Dainippon Screen Manufacturing Co., Ltd.) at 120° C. for 3 minutes by using the hot plate, and a prebaked film having a thickness of 8 μm was finally produced. A heat treatment on this film was carried out using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the substrate was taken out and divided into two pieces, and incisions were made 2 mm apart to produce a grid of 10 columns and rows in each substrate piece by using a single edged knife on the cured film. One of those sample substrates was used to count the number of peeled cells out of 100 which were tried to be peeled off using "Cello-tape (registered trademark)" and thereby to evaluate the adhesion property between the metal material and the cured resin film. Moreover, a pressure cooker test (PCT) machine (HAST CHAMBER EHS-211MD; manufactured by Tabai Espec Co.) was used to treat the other sample substrate for PCT for 400 hours under the saturation conditions at 121° C. and 2 atmospheres, and then the above-described peeling-off test was performed. For either substrate in the peeling-off tests, a case of no peeled cell was evaluated as very good and scored 4, a case of 1 or more and less than 20 peeled cells was evaluated as good and scored 3, a case of 20 or more and less than 50 peeled cells was evaluated as acceptable and scored 2, and a case of 50 or more peeled cells was evaluated as poor and scored 1.

(5) Calculation of the Rate of Ring-Closure (Ring Closure Rate) in a Cured Film

The obtained cured film (A) was heated in the range of 300 to 350° C. to obtain a cured film (B). The infrared absorption spectra of the cured film (A) and cured film (B) were measured to determine the absorbance at a peak at about 1050 $cm^{-1}$ due to C—O stretch vibration. In the measurement of the infrared absorption spectra, "FT-720" (trade name, manufactured by Horiba, Ltd.) was used as a measuring device. The rate of ring-closure of the cured film (A) was calculated from the following formula, where the rate of ring-closure of the cured film (B) was set to 100%. The rate of ring-closure as used herein refers to the rate of ring-closure of a poly(o-hydroxyamide) structural unit. In the present examples, a cured film was produced from the varnish and the rate of ring-closure thereof was calculated. For the calculation of a rate of ring-closure in the present examples, the varnish was applied onto a silicon wafer by spin-coating and then dried at 120° C. for 3 minutes to obtain a coated film having a film thickness of 5 μm. This coated film was further heated either at 220° C. for 10 minutes or at 3320° C. for 10 minutes to obtain cured films (a cured film (A) heated at 220° C. and a cured film (B) heated at 320° C.). The cured film (A) and cured film (B) were used to calculate the rate of ring-closure of the cured film (A) from the following formula. The heating temperature for the cured film (A) is the curing temperature of the cured film. The heating temperature for the cured film (B), that is, 320° C. is the temperature at which the component (A) in a cured film is completely cured (a curing rate of 100% is achieved). The thermal decomposition temperature of a cured film can be analyzed by thermal gravimetric analysis (TGA).

The ring closure rate of the cured film $(A)$ =

$$\frac{\text{The absorbance in the cured film }(A)}{\text{The absorbance in the cured film }(B)} \times 100$$

(6) Reliability Test A reliability test was performed by the following procedures.

(6)-1. Evaluation of Mechanical Properties after High-Temperature Storage (HTS)

The varnish was applied onto an eight-inch silicon wafer by a spin-coating method using the coating/developing machine ACT-8 such that the varnish would have a film thickness of 11 μm after prebaking at 120° C. for 3 minutes, and was prebaked, followed by a heat treatment using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the wafer was taken out and then treated at 150° C. for 500 hours by using a high-temperature storage testing device. The wafer was taken out and dipped in 45% by mass hydrofluoric acid for 5 minutes to peel off a resin composition film from the wafer. This film was cut into 1 cm wide and 9 cm long strips and measured for elongation at break using the Tensilon RTM-100 (manufactured by Orientec Co., Ltd.) by pulling the strips at a traction speed of 5 mm/min and at a room temperature of 23.0° C. and a humidity of 45.0% RH. Ten strips per specimen were measured and elongation at breask was determined as the arithmetic average value of the top five results. A cured film having an elongation at break of 60% or more was evaluated as very good and scored 4, a cured film having an elongation at break of 20% or more and less than 60% was evaluated as good and scored 3, a cured film having an elongation at break of 10% or more and less than 20% was evaluated as acceptable and scored 2, and a cured film having an elongation at break of less than 10% was evaluated as poor and scored 1.

(6)-2. Evaluation of Adhesion after High-Temperature Storage (HTS)

The varnish was applied onto a copper-plated substrate having a thickness of about 3 μm by a spin-coating method using a spinner (manufactured by Mikasa Co., Ltd.) and then baked on a hot plate (D-SPIN; manufactured by Dainippon Screen Manufacturing Co., Ltd.) at 120° C. for 3 minutes by using the hot plate, and a prebaked film having a thickness of 8 μm was finally produced. A heat treatment on this film was carried out using the inert oven CLH-21CD-S (manufactured by Koyo Thermo Systems Co., Ltd.), in which the temperature was increased to 220° C. at a temperature rising rate of 3.5° C./min and then held constant at 220° C. for one hour at an oxygen concentration of not higher than 20 ppm. Upon reaching a temperature of not higher than 50° C., the substrate was taken out and incisions were made 2 mm apart to produce a grid of 10 columns and 10 rows by using a single edged knife on the cured film. A heat treatment on this sample substrate was carried out at 150° C. for 500 hours by using the high-temperature storage testing device, and then the above-described peeling-off test was performed. For any substrate in the peeling-off test, a case of no peeled cell was evaluated as very good and scored 4, a case of 1 or more and less than 20 peeled cells was evaluated as good and scored 3, a case of 20 or more and less than 50 peeled cells was evaluated as acceptable and scored 2, and a case of 50 or more peeled cells was evaluated as poor and scored 1.

Synthesis Example 1: Synthesis of an Alkaline-Solution-Soluble Polyamide Resin (A-1)

Under dry nitrogen gas flow, 2,2-bis(3-amino-4-hydroxyphenyl)hexafluoropropane (hereinafter referred to as BAHF) (27.47 g, 0.075 moles) was dissolved in 257 g of NMP. To this, 1,1'-(4,4'-oxybenzoyl)diimidazole (hereinafter referred to as PBOM) (17.20 g, 0.048 moles) was added along with 20 g of NMP, and the resulting mixture was allowed to react at 85° C. for 3 hours. Subsequently, RT-1000 containing propylene oxide and tetramethylene ether glycol structures (20.00 g, 0.020 moles), 1,3-bis(3-aminopropyl)tetramethyldisiloxane (1.24 g, 0.0050 moles), and PBOM (14.33 g, 0.044 moles) were added thereto along with 50 g of NMP, and the resulting mixture was allowed to react at 85° C. for one hour. Furthermore, 5-norbornene-2,3-dicarboxylic anhydride (3.94 g, 0.024 moles) as an end cap compound was added thereto along with 10 g of NMP, and the resulting mixture was allowed to react at 85° C. for 30 minutes. After completion of the reaction, the reaction mixture was cooled down to room temperature, and acetic acid (52.82 g, 0.50 moles) was added thereto along with 87 g of NMP and stirred at room temperature for one hour. After the stirring was finished, the solution was poured into 3 L of water to afford a white precipitate. This precipitate was collected by filtration, washed three times with water, and then dried in a forced-air drier at 50° C. for 3 days to afford an alkali-soluble polyamide resin (A-1) in powder form. The results of the evaluation by the above-described methods indicated that the weight-average molecular weight of the resin (A-1) was 40,000 and the PDI was 2.2.

Synthesis Example 2: Synthesis of an Alkali-Soluble Polyamide Resin (A-2)

Under dry nitrogen gas flow, BAHF (29.30 g, 0.080 moles) and RT-1000 containing propylene oxide and tetramethylene ether glycol structures (20.00 g, 0.020 moles) were dissolved in 205 g of NMP. PBOM (28.67 g, 0.080 moles) was added thereto along with 20 g of NMP, and the resulting mixture was allowed to react at 85° C. for 3 hours. Subsequently, 2,2'-bis[N-(3-aminobenzoyl)-3-amino-4-hydroxyphenyl]hexafluoropropane (hereinafter referred to as HFHA) (0.60 g, 0.0010 moles) and 1,3-bis(3-aminopropyl)tetramethyldisiloxane (1.49 g, 0.0060 moles) were added thereto along with 20 g of NMP, and the resulting mixture was allowed to react at 85° C. for 30 minutes. Subsequently, 5-norbornene-2,3-dicarboxylic anhydride (6.57 g, 0.040 moles) as an end cap compound was added thereto along with 10 g of NMP, and the resulting mixture was allowed to react at 85° C. for 30 minutes. Furthermore, 4,4'-oxydiphthalic anhydride (hereinafter referred to as ODPA) (2.17 g, 0.0070 moles) was added thereto along with 30 g of NMP, and the resulting mixture was allowed to react at 85° C. for one hour. After completion of the reaction, the reaction mixture was cooled down to room temperature, and acetic acid (48.02 g, 0.50 moles) was added thereto along with 67 g of NMP and stirred at room temperature for one hour. After the stirring was finished, the solution was poured into 3 L of water to afford a white precipitate. This precipitate was collected by filtration, washed three times with water, and then dried in a forced-air drier at 50° C. for 3 days to afford an alkali-soluble polyamide resin (A-2) in powder form. The results of the evaluation by the above-described methods indicated that the weight-average molecular weight of the resin (A-2) was 31,600 and the PDI was 1.9.

Synthesis Example 3: Synthesis of an Alkali-Soluble Polyamide Resin (A-3)

According to the above Synthesis Example 2, BAHF (32.96 g, 0.090 moles), PBOM (29.38 g, 0.082 moles), RT-1000 (10.00 g, 0.010 moles), 1,3-bis(3-aminopropyl)tetramethyldisiloxane (1.49 g, 0.0060 moles), 5-norbornene-2,3-dicarboxylic anhydride (5.91 g, 0.036 moles), HFHA (0.60 g, 0.0010 moles), ODPA (2.17 g, 0.0070 moles), acetic acid (49.22 g, 0.50 moles), and 360 g of NMP were used similarly to obtain an alkali-soluble polyamide resin (A-3) in powder form. The results of the evaluation by the above-described methods indicated that the weight-average molecular weight of the resin (A-3) was 30,200 and the PDI was 2.2.

Synthesis Example 4: Synthesis of an Alkali-Soluble Polyamide Resin (A-4)

According to the above Synthesis Example 1, BAHF (34.79 g, 0.095 moles), PBOM (31.53 g, 0.088 moles), 1,3-bis(3-aminopropyl)tetramethyldisiloxane (1.24 g, 0.0050 moles), 5-norbornene-2,3-dicarboxylic anhydride (3.94 g, 0.024 moles), acetic acid (52.82 g, 0.50 moles), and 352 g of NMP were used similarly to obtain an alkali-soluble polyamide resin (A-4) in powder form. The results of the evaluation by the above-described methods indicated that the weight-average molecular weight of the resin (A-4) was 35,800 and the PDI was 2.5.

Synthesis Example 5: Synthesis of a Poly(o-Hydroxyamide) (A-5)

Under dry nitrogen gas flow, 100 g of N-methylpyrrolidone was placed and 2,2-bis(3-amino-4-hydroxyphenyl)hexafluoropropane (32.96 g, 0.090 moles) and m-aminophenol (2.18 g, 0.020 moles) were added thereto, and the resulting mixture was stirred and dissolved at room temperature. Subsequently, dodecanedioic acid dichloride (20.04 g, 0.075 moles) was added dropwise over 10 minutes to the reaction solution while maintaining the temperature in the range of −10 to 0° C., and then diphenyl ether 4,4'-dicarbonyl dichloride (7.38 g, 0.025 moles) was added, and the resulting mixture was stirred at room temperature for 3 hours. The reaction solution was poured into 3 L of water, and the resulting precipitate was collected and washed three times with pure water, and then dried in a forced-air drier at 50° C. for 3 days to afford a poly(o-hydroxyamide) (A-5) in powder form. The results of the evaluation by the above-described methods indicated that the weight-average molecular weight of the resin (A-5) was 31,000 and the PDI was 2.3.

Synthesis Example 6: Synthesis of an Alkali-Soluble Polyamide Resin (A-6)

According to the above Synthesis Example 2, BAHF (32.96 g, 0.090 moles), PBOM (29.38 g, 0.082 moles), HT-1100(11.00 g, 0.010 moles), 1,3-bis(3-aminopropyl)tetramethyldisiloxane (1.49 g, 0.0060 moles), 5-norbornene-2,3-dicarboxylic anhydride (5.91 g, 0.036 moles), HFHA (0.60 g, 0.0010 moles), ODPA (2.17 g, 0.0070 moles), acetic acid (49.22 g, 0.50 moles), and 360 g of NMP were used similarly to obtain an alkali-soluble polyamide resin (A-6) in powder form. The results of the evaluation by the above-described methods indicated that the weight-average molecular weight of the resin (A-6) was 31,200 and the PDI was 2.3.

Synthesis Example 7: Synthesis of an Alkali-Soluble Polyamide Resin (A-7)

According to the above Synthesis Example 2, BAHF (32.96 g, 0.090 moles), PBOM (29.38 g, 0.082 moles), HT-1700(17.00 g, 0.010 moles), 1,3-bis(3-aminopropyl)tetramethyldisiloxane (1.49 g, 0.0060 moles), 5-norbornene-2,3-dicarboxylic anhydride (5.91 g, 0.036 moles), HFHA (0.60 g, 0.0010 moles), ODPA (2.17 g, 0.0070 moles), acetic acid (49.22 g, 0.50 moles), and 360 g of NMP were used similarly to obtain an alkali-soluble polyamide resin (A-7) in powder faint. The results of the evaluation by the above-described methods indicated that the weight-average molecular weight of the resin (A-7) was 32,100 and the PDI was 2.4.

Synthesis Example 8: Synthesis of a Cyclized Polyimide Resin (A-8)

Under dry nitrogen gas flow, BAHF (11.9 g, 0.0325 moles), RT-1000 (15.0 g, 0.015 moles), 1,3-bis(3-aminopropyl)tetramethyldisiloxane (0.62 g, 0.0025 moles), and 5-norbornene-2,3-dicarboxylic acid (0.82 g, 0.005 moles) were dissolved in 125 g of NMP. To this, 4,4'-oxydiphthalic anhydride (13.95 g, 0.045 moles) was added along with 25 g of NMP, and the resulting mixture was stirred at 60° C. for one hour and then at 180° C. for 4 hours. After the stirring was finished, the solution was poured into 3 L of water to afford a white precipitate. This precipitate was collected by filtration, washed three times with water, and then dried in a forced-air drier at 50° C. for 3 days to afford a cyclized polyimide resin (A-8) in powder form. The imidation rate of the obtained resin was 97%. The results of the evaluation by the above-described methods indicated that the weight-average molecular weight of the resin (A-8) was 38,800 and the PDI was 1.9.

Examples 1 to 10, Comparative Examples 1 to 5

To 10 g each of the obtained resins (A-1 to 7), 2.0 g of a photo acid generator represented as the component (B) by the following formula, HMOM-TPHAP (C1) and MW-100LM (C2) as the components (C) were added, and then 20 g of γ-butyrolactone as a solvent was added thereto to produce varnishes, and their properties were determined by the above-described evaluation methods. The obtained results are shown in Table 1.

Examples 11 to 20, Comparative Examples 6 to 8

To 10 g each of the obtained resins (A-1 to 7), 2.0 g of a photo acid generator represented as the component (B) by the following formula, 0.5 g of HMOM-TPHAP (C1) and 0.5 g of MW-100LM (C2) as the components (C) were added, and then 20 g of γ-butyrolactone as a solvent was added thereto to produce varnishes, and components (D-1), (D-2), (E-1), (E-2) and (F) represented by the following formulae were further added singly thereto according to the indicated parts by mass in Table 2 to produce the varnishes, and their properties were determined by the above-described evaluation methods. The obtained results are shown in Table 2.

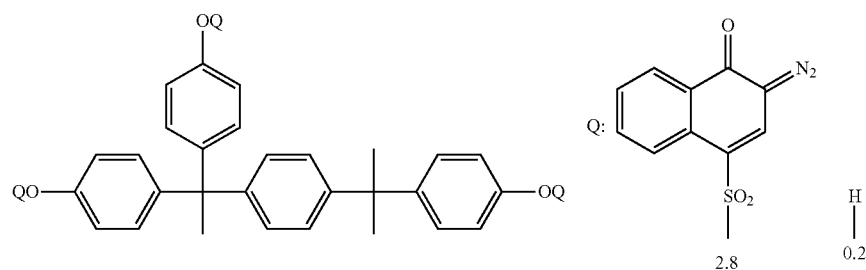
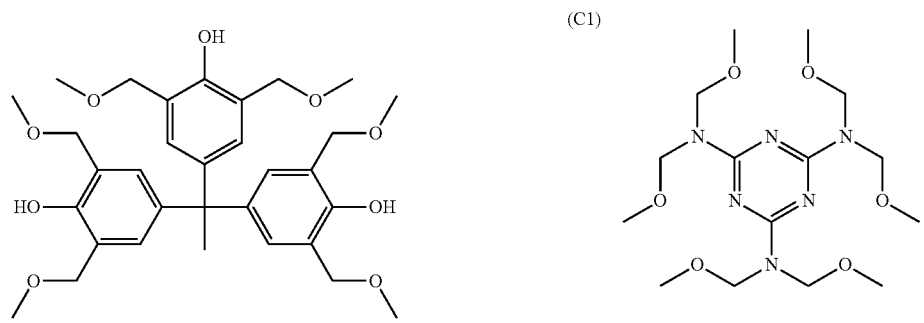
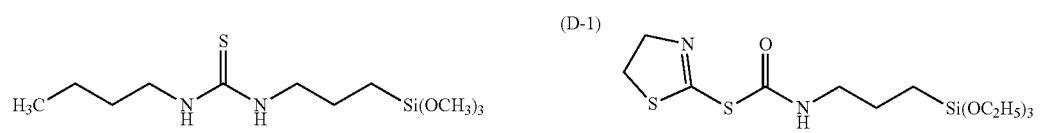
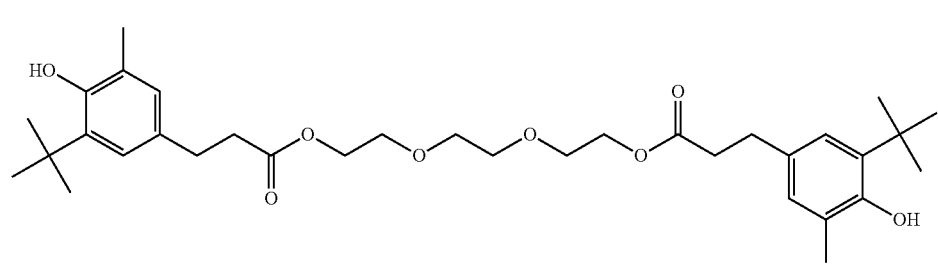
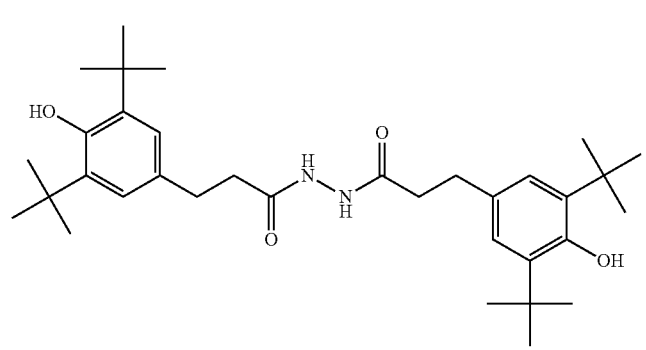
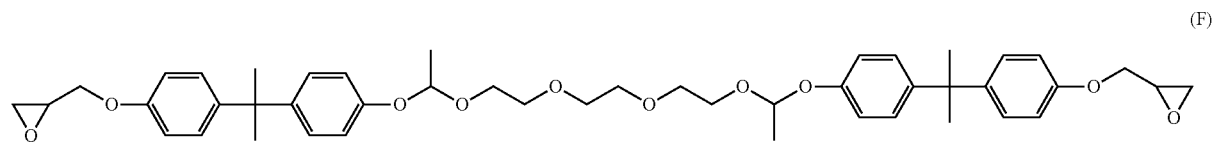

TABLE 2

|  | Resin containing the structural unit (A) | Heat-crosslinker (C) | Rate of ring-closure (%) | Stress (warpage stress) MPa | Score | Elongation at break % | Score | Adhesion Before PCT test | Adhesion After PCT test |
|---|---|---|---|---|---|---|---|---|---|
| Example 1 | A-1 | C1(0.1)/C2(1.5) | 3 | 17 | 3 | 82 | 4 | 4 | 4 |
| Example 2 |  | C1(0.6)/C2(1.5) | 4 | 19 | 3 | 71 | 4 | 4 | 4 |
| Example 3 | A-2 | C1(0.1)/C2(1.5) | 2 | 24 | 2 | 79 | 4 | 4 | 4 |
| Example 4 |  | C1(0.6)/C2(1.5) | 2 | 26 | 2 | 69 | 4 | 4 | 4 |
| Example 5 | A-3 | C1(0.1)/C2(1.5) | 2 | 23 | 2 | 74 | 4 | 4 | 4 |
| Example 6 |  | C1(0.6)/C2(1.5) | 3 | 27 | 2 | 61 | 4 | 4 | 4 |
| Example 7 | A-6 | C1(0.1)/C2(1.5) | 4 | 21 | 2 | 78 | 4 | 4 | 4 |
| Example 8 |  | C1(0.6)/C2(1.5) | 3 | 25 | 2 | 67 | 4 | 4 | 4 |
| Example 9 | A-7 | C1(0.1)/C2(1.5) | 4 | 19 | 3 | 80 | 4 | 4 | 4 |
| Example 10 |  | C1(0.6)/C2(1.5) | 5 | 24 | 2 | 71 | 4 | 4 | 4 |
| Comparative Example 1 | A-4 | C1(0.1)/C2(1.5) | 1 | 27 | 2 | 39 | 3 | 4 | 4 |
| Comparative Example 2 |  | C1(0.6)/C2(1.5) | 2 | 29 | 2 | 35 | 3 | 4 | 4 |
| Comparative Example 3 | A-5 | C1(0.1)/C2(1.5) | 73 | 25 | 2 | 80 | 4 | 1 | — |
| Comparative Example 4 |  | C1(0.6)/C2(1.5) | 72 | 31 | 1 | 57 | 3 | 1 | — |
| Comparative Example 5 | A-1 | C1(3.5)/C2(2.0) | 2 | 34 | 1 | 28 | 3 | 4 | 3 |

|  | Resin containing the structural unit (A) | Contents of the components (D), (E) and (F) | | | Rate of ring-closure (%) | Stress (warpage stress) MPa | Score | Elongation at break % | Score | Elongation at break after HTS % | Score | Adhesion Before PCT test or HTS | After PCT test | After HTS test |
|---|---|---|---|---|---|---|---|---|---|---|---|---|---|---|
|  |  | Component (D), part by mass | Component (E), part by mass | Component (F), part by mass |  |  |  |  |  |  |  |  |  |  |
| Example 11 | A-3 | — | — | — | 3 | 24 | 2 | 82 | 4 | 38 | 2 | 4 | 4 | 2 |
| Example 12 | A-6 | — | — | — | 4 | 19 | 3 | 89 | 4 | 43 | 3 | 4 | 4 | 2 |
| Example 13 | A-3 | (D-1) 0.15 g | — | — | 3 | 23 | 2 | 78 | 4 | 37 | 2 | 4 | 4 | 3 |
| Example 14 | A-3 | (D-2) 0.15 g | — | — | 3 | 23 | 2 | 76 | 4 | 38 | 2 | 4 | 4 | 3 |
| Example 15 | A-3 | — | (E-1) 0.15 g | — | 3 | 24 | 2 | 75 | 4 | 45 | 3 | 4 | 4 | 3 |
| Example 16 | A-3 | — | (E-2) 0.15 g | — | 3 | 24 | 2 | 74 | 4 | 55 | 3 | 4 | 4 | 3 |
| Example 17 | A-3 | (D-2) 0.15 g | (E-2) 0.15 g | — | 3 | 24 | 2 | 70 | 4 | 56 | 3 | 4 | 4 | 4 |
| Example 18 | A-3 | (D-2) 0.15 g | (E-1) 0.15 g | (F) 1.5 g | 3 | 23 | 2 | 80 | 4 | 65 | 4 | 4 | 4 | 4 |
| Example 19 | A-3 | (D-2) 0.15 g | (E-1) 0.15 g | (F) 0.18 g | 3 | 24 | 2 | 76 | 4 | 45 | 3 | 4 | 4 | 4 |
| Example 20 | A-3 | (D-2) 0.15 g | (E-1) 0.15 g | (F) 2.0 g | 3 | 24 | 2 | 82 | 4 | 55 | 3 | 4 | 4 | 4 |
| Comparative Example 6 | A-5 | — | — | — | 73 | 31 | 1 | 70 | 4 | 43 | 3 | 1 | — | — |
| Comparative Example 7 | A-8 | — | — | — | — | 14 | 3 | 20 | 2 | 3 | 1 | 4 | 3 | 1 |
| Comparative Example 8 | A-5 | (D-2) 0.15 g | (E-1) 0.15 g | (F) 1.5 g | 72 | 30 | 1 | 69 | 4 | 42 | 3 | 1 | — | — |

The values in the parentheses have indicated the contents (parts by mass) relative to 100 parts by mass of a resin based on the component (A).

REFERENCE SIGNS LIST 1. silicon wafer
2. Al pad
3. passivation film
4. insulating film
5. metal film (Cr, Ti, or the like)
6. metal line (Al, Cu, or the like)
7. insulating film
8. barrier metal
9. scribe line
10. solder bump

The invention claimed is:

1. A cured film formed by curing a photosensitive resin composition, wherein the photosensitive resin composition comprises a polyhydroxyamide, and wherein the rate of ring-closure of the polyhydroxyamide is not more than 10%, wherein the polyhydroxyamide has a structural unit (A) represented by the general formula (1):

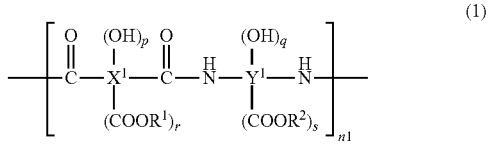

(1)

wherein $X^1$ and $Y^1$ each independently represents an organic group having two to eight valences and containing two or more carbon atoms;

$R^1$ and $R^2$ each independently represents either a hydrogen atom or a $C_1$-$C_{20}$ organic group;

n1 is an integer number from 2 to 500;

p and q are each independently an integer number from 0 to 4; and r and s each independently represents an integer number from 0 to 2; and wherein the polyhydroxyamide has a polyether structural unit represented by the general formula (2):

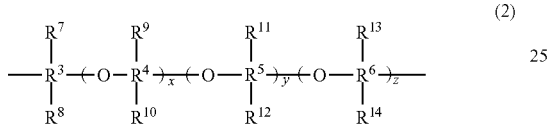

(2)

wherein $R^3$ to $R^6$ each independently represents a $C_1$-$C_6$ alkylene group;

$R^7$ to $R^{14}$ each independently represents a hydrogen atom, fluorine atom, or $C_1$-$C_6$ alkyl group; and x, y, and z each independently represents an integer number from 0 to 35; and wherein the structure indicated in each parenthesis is different from each other.

2. The cured film according to claim 1, wherein the rate of ring-closure of the polyhydroxyamide in the cured film is not less than 0.1% and not more than 10%.

3. The cured film according to claim 1, wherein the molecular weight of the polyether structural unit represented by the general formula (2) is not less than 150 and not more than 2,000.

4. The cured film according to claim 1, wherein the content of the polyether structural unit represented by the general formula (2) is 5 to 40% by mole of the total diamine residues.

5. The cured film according to claim 1, wherein the photosensitive resin composition further comprises a compound (B) that generates an acid upon light exposure, and a heat-crosslinker (C).

6. The cured film according to claim 1, wherein the polyhydroxyamide is a poly(o-hydroxyamide).

7. The cured film according to claim 1, wherein the photosensitive resin composition further comprises a compound (D) represented by the general formula (3):

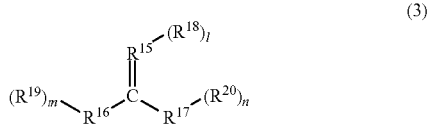

(3)

wherein in general formula (3), $R^{15}$ to $R^{17}$ represent an O, S, or N atom, provided that at least one of $R^{15}$ to $R^{17}$ represents an S atom; l is 0 or 1; m and n represent an integer number from 0 to 2;

and $R^{18}$ to $R^{20}$ each independently represent a hydrogen atom or a $C_1$-$C_{20}$ organic group.

8. The cured film according to claim 1, further comprising a compound (E) represented by the general formula (4) below:

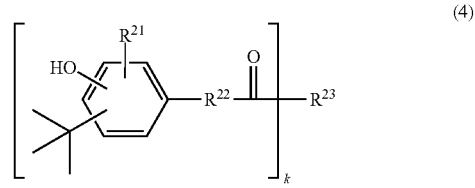

(4)

wherein in general formula (4), $R^{21}$ represents a hydrogen atom or an alkyl group containing two or more carbon atoms; $R^{22}$ represents an alkylene group containing two or more carbon atoms; $R^{23}$ represents an organic group having one to four valences and comprising at least any of an alkylene group containing two or more carbon atoms, O atom, and N atom; and k represents an integer number from 1 to 4.

9. The cured film according to claim 1, further comprising a heat-crosslinker (F) having a structural unit represented by the general formula (5) below:

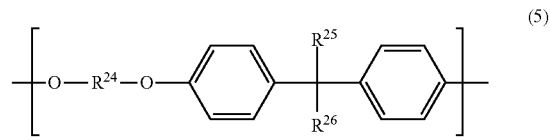

(5)

wherein in general formula (5), $R^{25}$ and $R^{26}$ each independently represent a hydrogen atom or methyl group; and $R^{24}$ is a divalent organic group comprising an alkylene group containing two or more carbon atoms, which may be linear, branched, or cyclic.

10. The cured film according to claim 1, wherein the content of the compound (E) represented by the general formula (4) is in the range of 10 to 50 parts by mass relative to 100 parts by mass of the heat-crosslinker (F) having a structural unit represented by the general formula (5).

11. A method of manufacturing the cured film according to claim 1, the method comprising the steps of: applying the photosensitive resin composition onto a substrate and drying it to form a photosensitive resin film, or forming a photosensitive sheet from the photosensitive resin composition and laminating it onto a substrate to form a photosensitive resin film; exposing the photosensitive resin film to light; developing the resulting film; and heat-treating the resulting film.

12. The method of manufacturing the cured film according to claim 11, wherein the step of heat-treating the photosensitive resin film includes the heat-treatment step at a temperature not lower than 170° C. and not higher than 250° C.

13. An interlayer insulating film or semiconductor protective film in which the cured film according to claim 1 is arranged.

14. A semiconductor electronic component or semiconductor device comprising a relief pattern layer of the cured film according to claim 1.

15. A semiconductor electronic component or semiconductor device, wherein the cured film according to claim 1 is arranged as an interlayer insulating film between re-wiring layers.

16. The semiconductor electronic component or semiconductor device according to claim 15, wherein a combination of the re-wiring layer and the interlayer insulating film is repeatedly arranged two to ten times.

17. A semiconductor electronic component or semiconductor device, wherein the cured film according to claim 1 is arranged as an interlayer insulating film between adjacent substrates composed of two or more different kinds of materials.

* * * * *